(12) United States Patent
Caron

(10) Patent No.: US 10,541,673 B2
(45) Date of Patent: Jan. 21, 2020

(54) ACOUSTIC WAVE FILTER INCLUDING TWO TYPES OF ACOUSTIC WAVE RESONATORS

(71) Applicant: Skyworks Solutions, Inc., Woburn, MA (US)

(72) Inventor: Joshua James Caron, Madison, NC (US)

(73) Assignee: Skyworks Solutions, Inc., Woburn, MA (US)

( * ) Notice: Subject to any disclaimer, the term of this patent is extended or adjusted under 35 U.S.C. 154(b) by 56 days.

(21) Appl. No.: 15/786,130

(22) Filed: Oct. 17, 2017

(65) Prior Publication Data

US 2018/0138893 A1 May 17, 2018

Related U.S. Application Data

(60) Provisional application No. 62/414,253, filed on Oct. 28, 2016, provisional application No. 62/426,104, (Continued)

(51) Int. Cl.

| | |
|---|---|
| *H03H 9/70* | (2006.01) |
| *H03H 9/72* | (2006.01) |
| *H03H 9/25* | (2006.01) |
| *H03H 9/64* | (2006.01) |
| *H04L 5/14* | (2006.01) |
| *H04L 5/00* | (2006.01) |
| *H04L 25/00* | (2006.01) |

(52) U.S. Cl.
CPC ............ *H03H 9/70* (2013.01); *H03H 9/25* (2013.01); *H03H 9/64* (2013.01); *H03H 9/706* (2013.01); *H03H 9/725* (2013.01); *H04L 5/001* (2013.01); *H04L 5/1461* (2013.01); *H04L 25/00* (2013.01)

(58) Field of Classification Search
CPC .............. H03H 9/725; H03H 9/25; H03H 9/64; H03H 9/706; H03H 9/70; H04L 5/001; H04L 5/1461; H04L 25/00
USPC .................................................. 333/133
See application file for complete search history.

(56) References Cited

U.S. PATENT DOCUMENTS

| | | |
|---|---|---|
| 6,424,238 B1 | 7/2002 | Penunuri |
| 7,230,510 B2 | 6/2007 | Lobeek |
| | (Continued) | |

FOREIGN PATENT DOCUMENTS

| | | |
|---|---|---|
| CN | 105471407 A | 4/2016 |
| TW | I287355 B | 9/2007 |

OTHER PUBLICATIONS

Aigner, "BAW and the 'Edge of Tomorrow' in wireless communication: Innovate, Ramp, Repeat", 2015 (Year: 2015).*

(Continued)

*Primary Examiner* — Benny T Lee
*Assistant Examiner* — Hafizur Rahman
(74) *Attorney, Agent, or Firm* — Knobbe, Martens, Olson & Bear, LLP

(57) ABSTRACT

Aspects of this disclosure relate to a multiplexer, such as a duplexer, a quadplexer, a hexaplexer, or the like. The multiplexer includes acoustic wave filters coupled to a common node. A first acoustic wave filter of the acoustic wave filters includes acoustic wave resonators of a first type and a series acoustic wave resonator of a second type coupled between the acoustic wave resonators of the first type and the common node.

24 Claims, 13 Drawing Sheets

Related U.S. Application Data filed on Nov. 23, 2016, provisional application No. 62/426,083, filed on Nov. 23, 2016.

(56) References Cited

U.S. PATENT DOCUMENTS

| | | |
|---|---|---|
| 7,283,016 B2 | 10/2007 | Haruta et al. |
| 7,893,794 B2 | 2/2011 | Ohashi et al. |
| 8,063,717 B2 | 11/2011 | Bradley et al. |
| 8,204,031 B2 | 6/2012 | Jian et al. |
| 9,106,199 B2 | 8/2015 | Deguet et al. |
| 9,231,557 B2 | 1/2016 | Umeda et al. |
| 9,240,622 B2 | 1/2016 | Schmidhammer et al. |
| 9,467,191 B2 | 10/2016 | Weissman et al. |
| 9,762,208 B2 | 9/2017 | Xu et al. |
| 9,825,611 B2 | 11/2017 | Hey-Shipton |
| 9,985,607 B2 | 5/2018 | Link et al. |
| 10,193,530 B2 | 1/2019 | Takamine |
| 2007/0057772 A1 | 3/2007 | Liu |
| 2007/0296521 A1 | 12/2007 | Schmidhammer |
| 2008/0042778 A1 | 2/2008 | Jamneala et al. |
| 2009/0009263 A1 | 1/2009 | Javid et al. |
| 2012/0154071 A1 | 6/2012 | Bradley et al. |
| 2013/0127565 A1 | 5/2013 | Nishihara et al. |
| 2013/0273860 A1 | 10/2013 | Pehlke |
| 2015/0222247 A1 | 8/2015 | Watanabe |
| 2016/0049921 A1 | 2/2016 | Khlat |
| 2016/0233895 A1 | 8/2016 | Khlat |
| 2016/0294423 A1 | 10/2016 | Yatsenko et al. |
| 2017/0214152 A1 | 7/2017 | Göttl et al. |

OTHER PUBLICATIONS

Browne, J., "Differentiating BAW and SAW Technologies", Microwaves & RF, Sep. 14, 2016 (Year: 2016).*

Qorvo white paper, "Addressing Carrier Aggregation Challenges Using Multiplexer Solutions", Jan. 2016 (Year: 2016).*

RFMD—Qorvo Datasheet for RFSW6042 (Year: 2015).*

Moorhead, P., "Qualcomm Raises Wireless Stakes With Full 5G Modules and More RF Offerings", Forbes Magazine, Feb. 27, 2018 (Year: 2018).*

International Search Report dated Mar. 2, 2018 for International Patent Application No. PCT/US2017/057455, 3 pages.

Written Opinion dated Mar. 2, 2018 for International Patent Application No. PCT/US2017/057455, 13 pages.

* cited by examiner

ACOUSTIC WAVE FILTER INCLUDING TWO TYPES OF ACOUSTIC WAVE RESONATORS

CROSS REFERENCE TO PRIORITY APPLICATIONS

Any and all applications for which a foreign or domestic priority claim is identified in the Application Data Sheet as filed with the present application are hereby incorporated by reference under 37 CFR § 1.57. This application claims the benefit of priority under 35 U.S.C. § 119(e) of U.S. Provisional Patent Application No. 62/414,253, filed Oct. 28, 2016 and titled "HYBRID SAW/BAW MULTIPLEXER;" U.S. Provisional Patent Application No. 62/426,104, filed Nov. 23, 2016 and titled "HYBRID SURFACE ACOUSTIC WAVE AND BULK ACOUSTIC WAVE MULTIPLEXER;" and U.S. Provisional Patent Application No. 62/426,083, filed Nov. 23, 2016 and titled "ACOUSTIC WAVE FILTER INCLUDING SURFACE ACOUSTIC WAVE RESONATORS AND BULK ACOUSTIC WAVE RESONATOR." The disclosures of each of these priority applications are hereby incorporated by reference in its entirety herein.

BACKGROUND

Technical Field

Embodiments of this disclosure relate to acoustic wave filters.

Description of Related Technology

An acoustic wave filter can include a plurality of resonators arranged to filter a radio frequency signal. Example acoustic wave filters include surface acoustic wave (SAW) filters and bulk acoustic wave (BAW) filters. A film bulk acoustic resonator (FBAR) filter is an example of a BAW filter.

Acoustic wave filters can be implemented in radio frequency electronic systems. For instance, filters in a radio frequency front end of a mobile phone can include acoustic wave filters. Two acoustic wave filters can be arranged as a duplexer.

BRIEF DESCRIPTION OF THE DRAWINGS

Embodiments of this disclosure will be described, by way of non-limiting example, with reference to the accompanying drawings.

SUMMARY OF CERTAIN INVENTIVE ASPECTS

Figure 1:
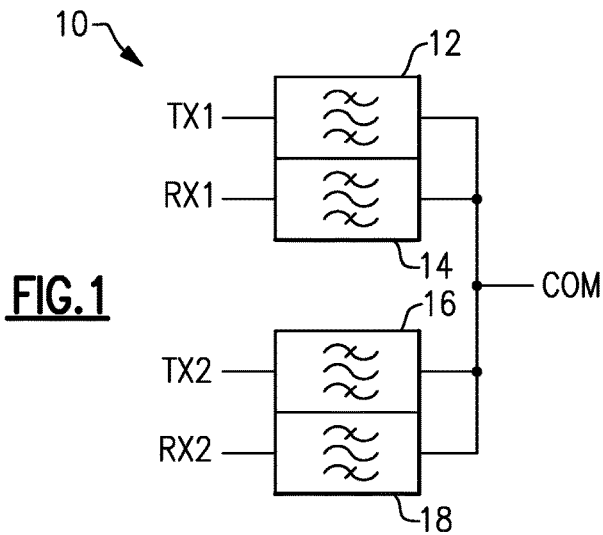
FIG. 1 is a schematic diagram of a quadplexer.

The innovations described in the claims each have several aspects, no single one of which is solely responsible for its desirable attributes. Without limiting the scope of the claims, some prominent features of this disclosure will now be briefly described.

One aspect of this disclosure is a filter assembly that includes a first acoustic wave filter coupled to a common node and a second acoustic wave filter coupled to the common node. The first acoustic wave filter includes surface acoustic wave resonators and a series bulk acoustic wave resonator coupled between the surface acoustic wave resonators and the common node.

The surface acoustic wave resonators can include a series surface acoustic wave resonator in series with the series bulk acoustic wave resonator. The series surface acoustic wave resonator can be a one-port resonator. The series surface acoustic wave resonator can be a double mode surface acoustic wave resonator.

The first acoustic wave filter can include more than twice as many surface acoustic wave resonators as bulk acoustic wave resonators. The surface acoustic wave resonators can implement at least 70% of resonators of the first acoustic wave filter. The surface acoustic wave resonators can implement at least 80% of resonators of the first acoustic wave filter.

The series bulk acoustic wave resonator can be coupled between all surface acoustic wave resonators of the first acoustic wave filter and the common node. The surface acoustic wave resonators can include at least five resonators.

The first acoustic wave filter can further include a shunt bulk acoustic wave resonator coupled to the common node. The shunt bulk acoustic wave resonator can be coupled to the surface acoustic wave resonators by way of the series bulk acoustic wave resonator.

The second acoustic wave filter can include second surface acoustic wave resonators and a second series bulk acoustic wave resonator coupled between the second surface acoustic wave resonators and the common node. The second acoustic wave filter can include one or more suitable features of the first acoustic wave filter.

The filter assembly can further include at least two additional acoustic wave filters coupled to the common node. The filter assembly can further include at least four additional acoustic wave filters coupled to the common node. The filter assembly can further include at least six additional acoustic wave filters coupled to the common node.

The filter assembly can be arranged as a triplexer. The filter assembly can be arranged a quadplexer. The filter assembly can be arranged a pentaplexer. The filter assembly can be arranged a hexaplexer. The filter assembly can be arranged a heptaplexer. The filter assembly can be arranged an octoplexer.

The common node can be an antenna node.

Another aspect of this disclosure is a multiplexer that includes four acoustic wave filters coupled to a common node. The four acoustic wave filters include a first acoustic wave filter that includes surface acoustic wave resonators and a series bulk acoustic wave resonator coupled between the surface acoustic wave resonators and the common node.

The multiplexer can be arranged as a quadplexer. The multiplexer can be arranged as a pentaplexer. The multiplexer can be arranged as a hexaplexer. The multiplexer can be arranged as a heptaplexer. The multiplexer can be arranged as an octoplexer.

The surface acoustic wave resonators can include a series surface acoustic wave resonator in series with the series bulk acoustic wave resonator. The series surface acoustic wave resonator can be a one-port resonator. The series surface acoustic wave resonator can be a double mode surface acoustic wave resonator.

The surface acoustic wave resonators can implement at least 70% of resonators of the first acoustic wave filter. The surface acoustic wave resonators can implement at least 80% of resonators of the first acoustic wave filter. At least 70% of resonators of multiplexer can be surface acoustic wave resonators. At least 80% of resonators of multiplexer can be surface acoustic wave resonators.

The series bulk acoustic wave resonator can be coupled between all surface acoustic wave resonators of the first acoustic wave filter and the common node. The surface acoustic wave resonators can include at least five resonators.

The first acoustic wave filter can further include a shunt bulk acoustic wave resonator coupled to the common node. The shunt bulk acoustic wave resonator can be coupled to the surface acoustic wave resonators by way of the series bulk acoustic wave resonator.

The four acoustic wave filters can include a second acoustic wave filter that includes second surface acoustic wave resonators and a second series bulk acoustic wave resonator coupled between the second surface acoustic wave resonators and the common node. The second acoustic wave filter can include one or more suitable features of the first acoustic wave filter. The four acoustic wave filters can also include a third acoustic wave filter that includes third surface acoustic wave resonators and a third series bulk acoustic wave resonator coupled between the third surface acoustic wave resonators and the common node. The third acoustic wave filter can include one or more suitable features of the first acoustic wave filter. The four acoustic wave filters can also include a fourth acoustic wave filter that includes fourth surface acoustic wave resonators and a fourth series bulk acoustic wave resonator coupled between the fourth surface acoustic wave resonators and the common node. The fourth acoustic wave filter can include one or more suitable features of the first acoustic wave filter.

Another aspect of this disclosure is a packaged module that includes one or more first die and a second die. The one or more first die includes a first group of surface acoustic wave resonators and a second group of surface acoustic wave resonators. The first group of surface acoustic wave resonators is included in a first acoustic wave filter coupled to a common node. The second die includes a series bulk acoustic wave resonator. The second group of surface acoustic wave resonators and the series bulk acoustic wave resonator are included in a second acoustic wave filter coupled to the common node. The series bulk acoustic wave resonator is coupled between the second group of surface acoustic wave resonators and the common node.

The packaged module can further include a multi-throw switch coupled to the first filter and the second filter. The multi-throw switch can have a single throw coupled to the common mode. Alternatively, the multi-throw switch can have a first throw coupled to the first acoustic wave filter and a second throw coupled to the second acoustic wave filter. In some instances, the packaged module can further include a power amplifier configured to provide a radio frequency signal to at least one of the first acoustic wave filter or the second acoustic wave filter by way of the multi-throw switch.

The packaged module can further include a power amplifier.

The packaged module can include one or more suitable features of an acoustic wave filter and/or a multiplexer discussed herein.

Another aspect of this disclosure is a wireless communication device that includes an antenna configured to receive a radio frequency signal and a multiplexer in communication with the antenna. The multiplexer includes four acoustic wave filters coupled to a common node. The four acoustic wave filters include a first acoustic wave filter that includes surface acoustic wave resonators and a series bulk acoustic wave resonator coupled between the surface acoustic wave resonators and the common node.

The wireless communication device can be configured as a mobile phone.

The wireless communication device can further include a frequency multiplexing circuit coupled between the common node and the antenna. The frequency multiplexing circuit can be a diplexer or a triplexer.

The wireless communication device can further include an antenna switch coupled between the common node and the antenna.

The radio frequency signal can be a carrier aggregation signal.

The antenna can be a primary antenna. The antenna can be diversity antenna. Each of the four acoustic wave filters can be configured as a receive filter in communication with the diversity antenna.

The wireless communication device can include one or more suitable features of any of the acoustic wave filters discussed herein, any of the multiplexers discussed herein, any of the packaged modules discussed herein, or any combination thereof.

Another aspect of this disclosure is a filter assembly that includes a first acoustic wave filter having a passband and being coupled to a common node. The filter assembly also includes a second acoustic wave filter coupled to the common node. The second acoustic wave filter includes acoustic wave resonators of a first type and a series acoustic wave resonator of a second type coupled between the acoustic wave resonators of the first type and the common node. The series acoustic wave resonator of the second type has a higher quality factor in the passband of the first acoustic wave filter than the acoustic wave resonators of the first type.

The acoustic resonators of the first type can be surface acoustic wave resonators and the series acoustic wave resonator of the second type can be a bulk acoustic wave resonator. The acoustic resonators of the first type can be non-temperature compensated surface acoustic wave resonators and the series acoustic wave resonator of the second type can be a temperature compensated surface acoustic wave resonator.

The acoustic wave resonators of the first type of the second acoustic wave filter can be at least 70% of resonators of the second acoustic wave filter. The filter assembly can include a first die that includes the acoustic wave resonators of the first type and a second die that includes the series acoustic wave resonator of the second type. At least two of the acoustic resonators of the first type can be in series with the series acoustic wave resonator of the second type.

The filter assembly can further include a third acoustic wave filter coupled to the common node and a fourth acoustic wave filter coupled to the common node. The series acoustic wave resonator of the second type can have a higher quality factor in a passband of the third acoustic wave filter than the acoustic wave resonators of the first type. The series acoustic wave resonator of the second type can have a higher quality factor in a passband of the fourth acoustic wave filter than the acoustic wave resonators of the first type.

Another aspect of this disclosure is a multiplexer with acoustic wave filters. The multiplexer includes a first acoustic wave filter coupled to a common node and three other acoustic wave filters coupled to the common node. The first acoustic wave filter includes acoustic wave resonators of a first type and a series acoustic wave resonator of a second type coupled between the acoustic wave resonators of the first type and the common node. Each of the three other acoustic wave filters has a respective pass band. The series acoustic wave resonator of the second type has a higher quality factor in each of the respective passbands of the three other acoustic wave filters than the acoustic wave resonators of the first type.

The acoustic resonators of the first type can be surface acoustic wave resonators and the series acoustic wave resonator of the second type can be a bulk acoustic wave resonator. The acoustic resonators of the first type can be non-temperature compensated surface acoustic wave resonators and the series acoustic wave resonator of the second type can be a temperature compensated surface acoustic wave resonator.

At least one of the three other acoustic wave filters can include second acoustic wave resonators of the first type and a second series acoustic wave resonator of the second type coupled between the second acoustic wave resonators of the first type and the common node.

The multiplexer can be a quadplexer. The multiplexer can further include two additional acoustic wave filters coupled to the common node.

Another aspect of this disclosure is a method of processing a carrier aggregation signal. The method includes filtering the carrier aggregation signal with a first acoustic wave filter that is coupled to an antenna port and has a first passband. The carrier aggregation signal includes a first radio frequency carrier in the first passband and a second radio frequency carrier in a second passband. The method further includes filtering the carrier aggregation signal with a second acoustic wave filter that is coupled to the antenna port and has the second passband. The second acoustic wave filter includes acoustic wave resonators of a first type and a series acoustic wave resonator of a second type coupled between the acoustic wave resonators of the first type and the antenna port. The series acoustic wave resonator of the second type has a lower loading loss than the acoustic wave resonators of the first type.

The method can further include receiving the carrier aggregation signal by way of an antenna coupled to the antenna port. The method can further include transmitting the carrier aggregation signal by way of an antenna coupled to the antenna port. The method can further include coupling the first acoustic wave filter and the second acoustic wave filter to the common node by way of a multi-throw switch. The multi-throw switch can couple the first acoustic wave filter and the second acoustic wave filter to the common node such that the first acoustic wave filter and the second acoustic wave filter are concurrently coupled to the common node.

The acoustic resonators of the first type can be surface acoustic wave resonators and the series acoustic wave resonator of the second type can be a bulk acoustic wave resonator. The acoustic resonators of the first type can be non-temperature compensated surface acoustic wave resonators and the series acoustic wave resonator of the second type can be a temperature compensated surface acoustic wave resonator. The acoustic resonators of the first type can be on a different die than the series acoustic wave resonator of the second type.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 15/785,913, titled "ACOUSTIC WAVE FILTER INCLUDING SURFACE ACOUSTIC WAVE RESONATORS AND BULK ACOUSTIC WAVE RESONATOR," filed on even date herewith, the entire disclosure of which is hereby incorporated by reference herein.

DETAILED DESCRIPTION OF CERTAIN EMBODIMENTS

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In order to increase cellular data bandwidth, service providers and handset manufacturers often implement carrier aggregation (CA), where multiple frequency bands are used simultaneously by a single handset for the transmission and/or reception of data. Since handset size and cost can drive manufacturers to use as few separate antennas as possible, many CA scenarios can benefit from the bands sharing a single antenna.

Whereas the traditional single-band (non-CA) case includes at most two band pass filters to be connected to the antenna (one transmit filter and one receive filter, the combination of which can be referred to as a duplexer), CA systems can include several more filters all connected to a common antenna node. Depending upon the CA specifications, these filters can be configured as a quadplexer (four filters), pentaplexer (five filters), hexaplexer (six filters), octoplexer (eight filters), etc. The general term used herein for all of these multi-filter configurations is multiplexer.

In such cases where multiple filters share a common connection, it can be desirable to ensure that each filter presents a high impedance to every other filter in the other filter's respective pass band. This can ensure that mutual loading of the filters is kept at or near a minimum. "Loading" in this context refers to increased insertion loss through one filter caused by unwanted signal dissipation and/or redirection by one or more of the other filters of a multiplexer.

By way of example, consider a duplexer including two filters for two frequency bands, Band X and Band Y, connected together to share a common antenna. One can think of the duplexer as a power divider, where the amount of power through each path can be determined by the frequency-dependent impedance presented by each of the two filters. If the filters were ideal, they could each present a perfect 50 Ohm antenna impedance within their respective pass bands, while presenting an open circuit impedance within the pass band of the other filter of the duplexer. In such a case, a signal at the antenna port within frequency Band X, for example, would see 50 Ohms through the Band X filter and an open circuit through the Band Y filter. Thus, in this ideal scenario, 100% of the power of the signal would flow through the Band X filter, and 0% would flow through the Band Y. Likewise for a signal within frequency Band Y, in the ideal scenario, 100% of the power would flow through the Band Y filter, and 0% through the Band X filter. If the filters were quite poor, on the other hand, such that they presented a 50 Ohm impedance at all frequencies, the power division would be quite different. In the Band X example, the signal would now be presented with 50 Ohm paths into both filters. Therefore, the power would be divided such that 50% flowed through the Band X filter and 50% through the Band Y filter. Thus, the Band X insertion loss would increase by approximately 3 dB. Put differently, this duplexer would have 3 dB of loading loss compared to the individual filters.

It can be seen that the overall loading loss would increase rapidly as the number of combined filters in a multiplexer increases. For instance, an octoplexer that includes such non-ideal filters could have an additional 9 dB of loading loss. Real-world radio frequency (RF) filters are not as good as the ideal filters described above where there is no loading loss at all, but they also do not behave as poorly as the 50 ohm impedance at all frequencies scenario. The magnitude of the out-of-band impedance can be a relatively strong function of the filter design, but it can also dependent upon the filter technology.

Surface acoustic wave (SAW) and bulk acoustic wave (BAW) technologies are both used ubiquitously for RF filters, and both are capable of achieving relatively high impedance values out of band. Compared head-to-head, however, world-class BAW filters generally outperform SAW filters in terms of out-of-band impedance magnitude over a wider frequency span. The difference in loading loss is relatively minor for the duplexer case, but can become increasingly significant as the number of CA filter combinations increases. In the case of a quadplexer, BAW filters often see a 0.5 dB to 1.0 dB loading loss advantage over their SAW filter counterparts. For hexaplexers and octoplexers, the difference is significantly larger still.

Unfortunately, despite their higher performance, BAW filters can come with a significant disadvantage compared to SAW filters—cost. BAW filters are generally much more difficult and expensive to manufacture than SAW filters. Therefore, there is a substantial incentive to use SAW technology whenever possible. SAW technology is adequate for making duplexers to cover most current cellular frequency bands. For CA combinations that use quadplexers, however, the tradeoff between cost and performance for the two technologies is less clear. For more complicated connections, such as hexaplexers and octoplexers, SAW performance typically degrades sufficiently such that it is often not an option regardless of cost savings.

There are ways to improve loading loss through careful control of the filter topology and/or design parameters. Ultimately, however, the loading loss can be limited, such as by spurious acoustic modes and out-of-band acoustic energy radiating out of the resonators due to the finite reflection bandwidth of the Bragg reflectors used to confine the in-band energy. For scenarios, such as many quadplexers or pentaplexers, where the cost/performance tradeoff is somewhat ambiguous, already-existing RF switches within cellular front-end modules can be used to create so-called "switched multiplexers" or "switch-plexers." In this case, the common CA connection is facilitated with a multi-pole, multi-throw RF switch that allows the filters to be used in either the traditional single-band configuration or as a CA combination. In CA mode, the loading loss is slightly worse than that of a hard-wired multiplexer (and worse still than a BAW multiplexer), but in non-CA mode, the loading loss can go away. Since a large portion of the total usage time of certain cellular handsets is in non-CA mode, the degraded performance (relative to BAW) can be limited mainly to CA mode, and this can tip the scales in favor of the less expensive SAW solution in such cellular handsets. The switch-plexing solution, while elegant, can be much more difficult to implement than a permanently multiplexed solution. Furthermore, it can involve a more complex and expensive calibration routine for handset manufacturers. As CA operation becomes more common and as the number of simultaneous connections increases, SAW technology is expected to have difficulty meeting certain CA specifications.

Certain aspects of the disclosure address the aforementioned problems by combining both SAW and BAW technology in a single system. Since the out-of-band impedance presented by each filter of a multiplexer can be determined primarily by the one or two resonators closest to the antenna connection, those specific resonators can be created using BAW technology. According to certain embodiments, these BAW resonators can include roughly 10-30% of the total number of resonators of a filter, and most or all of the remaining 70-90% of the resonators of the filter can be implemented with less expensive SAW technology. A multiplexer can include roughly 10-30% BAW resonators and most or all of the remaining 70-90% of the resonators of the multiplexer can be SAW resonators. Accordingly, certain embodiments can include hexaplexers or octoplexers with loading losses on par with all-BAW solutions, but much lower cost due to the large portion of SAW content. Thus, according to some embodiments, a system includes a multiplexer with a first number of one or more BAW resonators near the antenna connection, and a second number of SAW resonators further from the antenna connection, where the second number is higher than the first number.

Some embodiments combine the loading loss advantages of an all-BAW CA multiplexer with much of the cost advantage of an all-SAW solution.

One aspect of this disclosure is a filter assembly that includes a plurality of acoustic wave filters coupled to a common node. A first acoustic wave filter of the plurality of acoustic wave filters includes surface acoustic wave resonators and a bulk acoustic wave resonator arranged in series between all surface acoustic wave resonators of the first acoustic wave filter and the common mode. One or more of the other acoustic wave filters of the plurality of acoustic wave filters can include surface acoustic wave resonators coupled to the common node by way of a series bulk acoustic wave resonator. The bulk acoustic wave resonator can be an FBAR, for example. The first acoustic wave filter can also include a shunt bulk acoustic wave resonator. The plurality of acoustic wave filters can be arranged as a multiplexer, such as a duplexer, a triplexer, quadplexer, a pentaplexer, a hexaplexer, a heptaplexer, an octoplexer, or the like.

Another aspect of this disclosure is a multiplexer that includes at least four filters connected at a common node. At least one of the four filters includes at least a first type of resonator and a second type of resonator, in which the second type of resonator has lower loading loss than the first type of resonator. In the one of the four filters, all of the resonators of the first type are coupled to the common node by way of a series resonator of the second type. The second type of resonator can be a BAW resonator, such as a FBAR, and the first type of resonator can be a SAW resonator.

An antenna is configured to receive a radio frequency signal. The multiplexer is in communication with the antenna. The multiplexer includes four acoustic wave filters coupled to a common node. A first acoustic wave filter of the four acoustic wave filters includes surface acoustic wave resonators and a bulk acoustic wave resonator in series between the surface acoustic wave resonators and the common node. A frequency multiplexing circuit, such as a diplexer or a triplexer, and/or an antenna switch can be coupled between the multiplexer and the antenna. The radio frequency signal can be a carrier aggregation signal. The antenna can be a diversity antenna and the four filters can be receive filters in some applications. The multiplexer can include one or more additional acoustic wave filters coupled to the common node.

Another aspect of this disclosure is a packaged module that includes one or more first die and a second die. The one or more first die includes SAW resonators. The second die includes a BAW resonator. Acoustic wave filters coupled to a common node are implemented by the acoustic wave resonators on the one or more first die and the second die. A first acoustic wave filter of the acoustic wave filters includes the SAW resonators and the BAW resonator in series between the SAW resonators and the common node. The plurality of acoustic wave filters can be arranged as a multiplexer, such as a quadplexer, a pentaplexer, a hexaplexer, an octoplexer, or the like. The packaged module can also include one or more of a power amplifier, a band select switch, and an antenna switch.

Another aspect of this disclosure is a wireless communication device that includes an antenna and a multiplexer. The antenna is configured to receive a radio frequency signal. The multiplexer is in communication with the antenna. The multiplexer includes four acoustic wave filters coupled to a common node. A first acoustic wave filter of the four acoustic wave filters includes surface acoustic wave resonators and a bulk acoustic wave resonator in series between the surface acoustic wave resonators and the common node. A frequency multiplexing circuit, such as a diplexer or a triplexer, and/or an antenna switch can be coupled between the multiplexer and the antenna. The radio frequency signal can be a carrier aggregation signal. The antenna can be a diversity antenna and the four filters can be receive filters in some applications. The multiplexer can include one or more additional acoustic wave filters coupled to the common node.

FIG. 1 is a schematic diagram of a quadplexer 10. The quadplexer 10 includes four filters connected at a common node COM. The common node COM can be referred to as a common port. As illustrated, the quadplexer 10 includes a first transmit filter 12, a first receive filter 14, a second transmit filter 16, and a second receive filter 18. Each of the filters of the quadplexer 10 can be band pass filters as illustrated. One or more of the filters of the quadplexer 10 can be acoustic wave filters. All of the filters of the quadplexer 10 can be acoustic wave filters. Any of the filters of the quadplexer 10 can include two types of acoustic wave resonators in accordance with the principles and advantages discussed herein. For instances, any of the filters of the quadplexer 10 can include SAW resonators and one or more BAW resonators in accordance with the principles and advantages discussed herein.

Figure 2A:
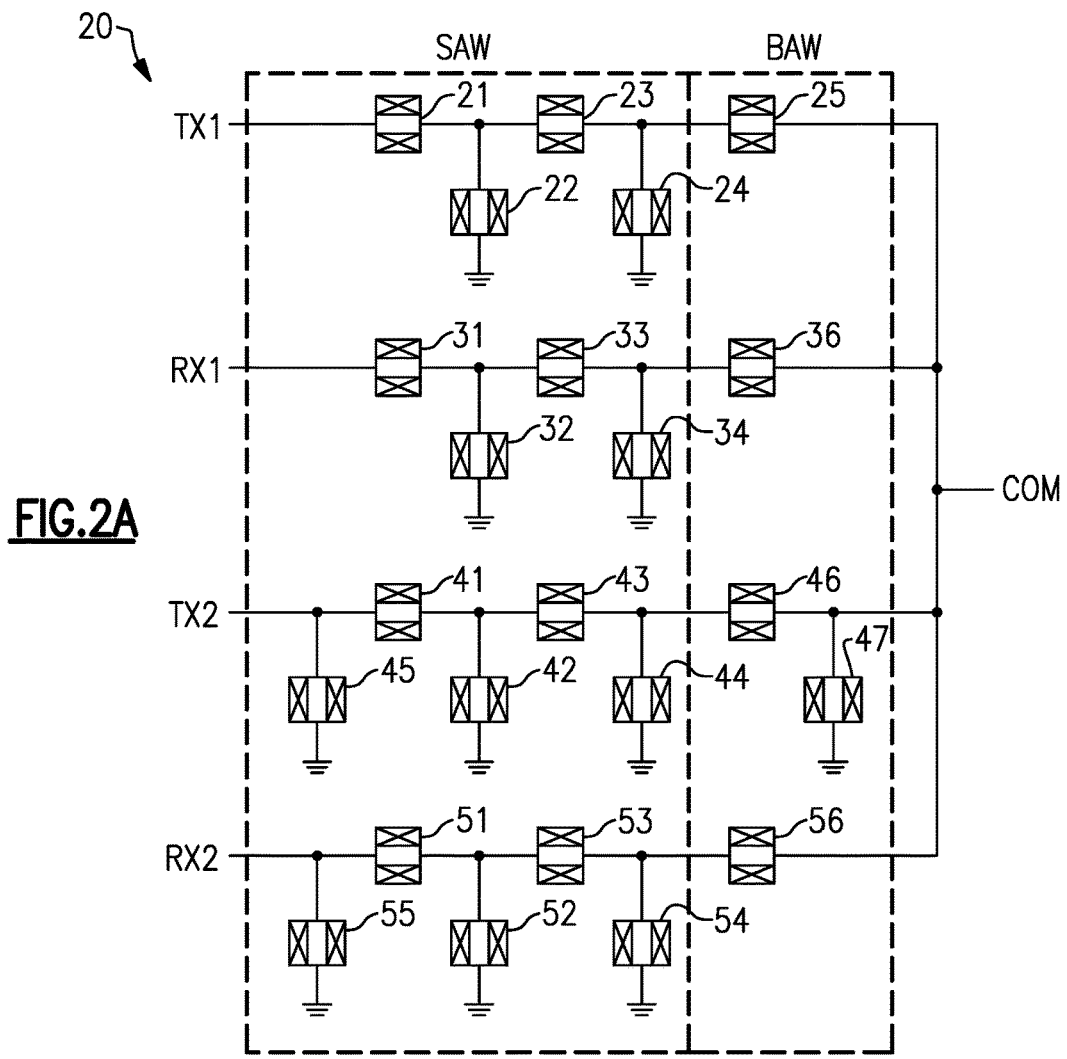
FIG. 2A is a schematic diagram of acoustic wave resonators of a quadplexer according to an embodiment.

FIG. 2A is a schematic diagram of acoustic wave resonators of a quadplexer 20 according to an embodiment. The quadplexer 20 is an example of the quadplexer 10 of FIG. 1. A multiplexer can be implemented in accordance with suitable principles and advantages discussed with reference to FIG. 2A. In FIG. 2A, each filter of the quadplexer 20 is implemented by acoustic wave resonators. Each of the illustrated acoustic wave resonators are 1-port resonators. Such resonators can include an interdigital transducer electrode with an input and an output of the resonator being opposite bus bars of the interdigital transducer electrode.

A first acoustic wave filter of the quadplexer 20 includes SAW resonators 21, 22, 23, and 24 and BAW resonator 25. A second acoustic wave filter of the quadplexer 20 includes SAW resonators 31, 32, 33, and 34 and BAW resonator 36. A third acoustic wave filter of the quadplexer 20 includes SAW resonators 41, 42, 43, 44, and 45 and BAW resonators 46 and 47. A fourth acoustic wave filter of the quadplexer 20 includes SAW resonators 51, 52, 53, 54, and 55 and BAW resonator 56.

As illustrated in FIG. 2A, a series SAW resonator in an acoustic wave filter can be coupled to a common node of a quadplexer by way of a series BAW resonator. As also illustrated in FIG. 2A, a series SAW resonator and a shunt SAW resonator in an acoustic wave filter can be coupled to a common node of a quadplexer by way of a series BAW resonator. FIG. 2A also shows that at least four or at least five SAW resonators can be coupled to a common node of a quadplexer by way of a series BAW resonator.

In the acoustic wave filters illustrated in FIG. 2A, all SAW resonators of each acoustic wave filter are coupled to the common node by way of a series BAW resonator of a respective acoustic wave filter. This can reduce loading on the common node relative to acoustic wave filters that include only SAW resonators. As also shown in FIG. 2A, at least 70% of resonators of a multiplexer and/or an acoustic wave filter can be SAW resonators and the other resonator(s) of the multiplexer and/or the acoustic wave filter can be implemented by BAW technology. By using mostly SAW resonators to implement an acoustic wave filter, such an acoustic wave filter can be less expensive than an acoustic wave filter implemented mostly or completely by BAW resonators.

Figure 4:
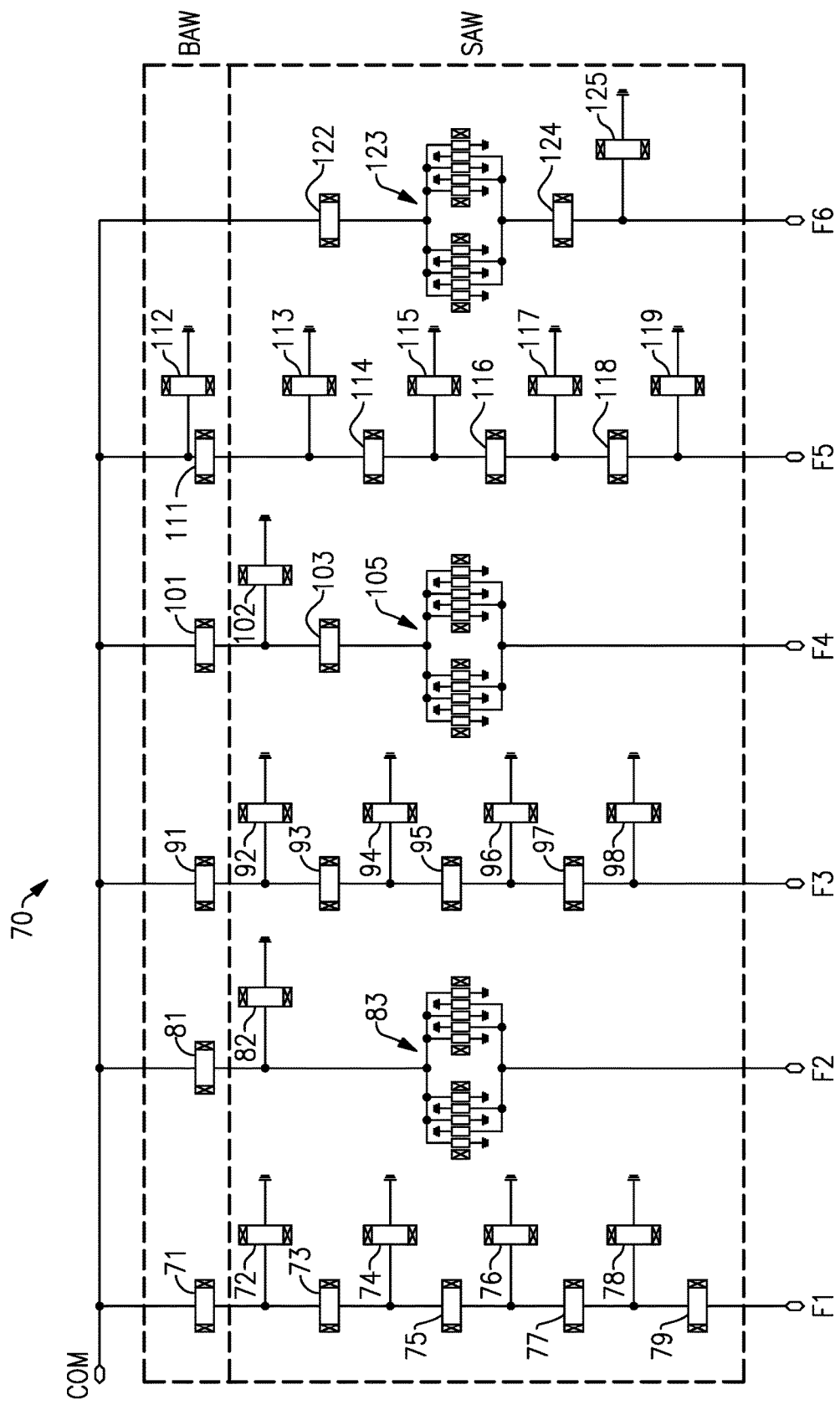
FIG. 4 is a schematic diagram of acoustic wave resonators of a hexaplexer according to an embodiment.
Figure 5:
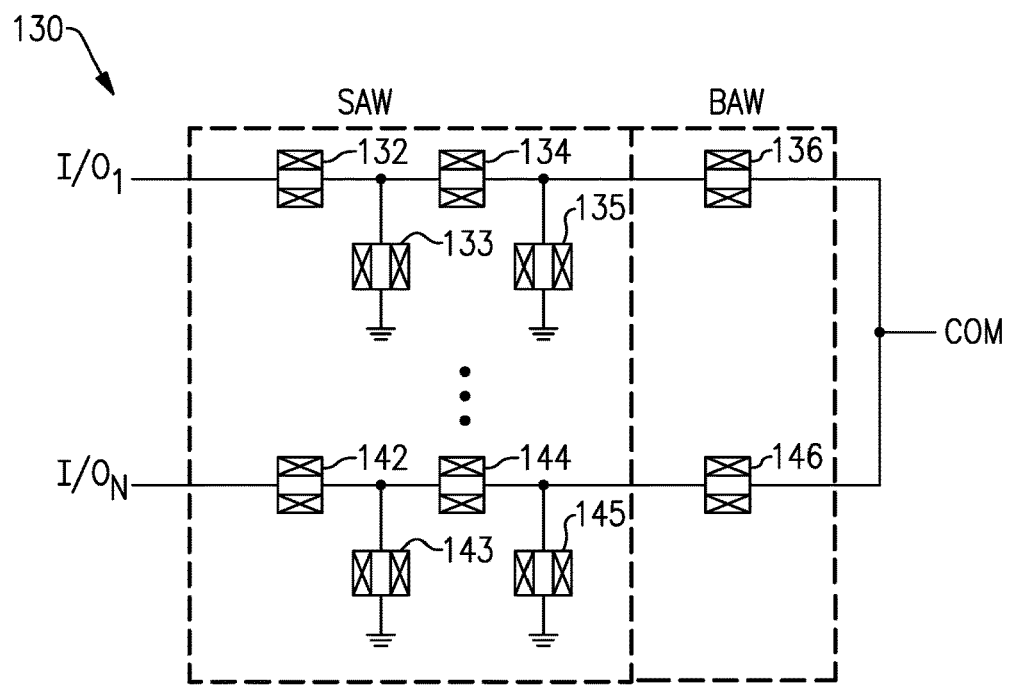
FIG. 5 is a schematic diagram of acoustic wave resonators of a multiplexer according to an embodiment.
Figure 6:
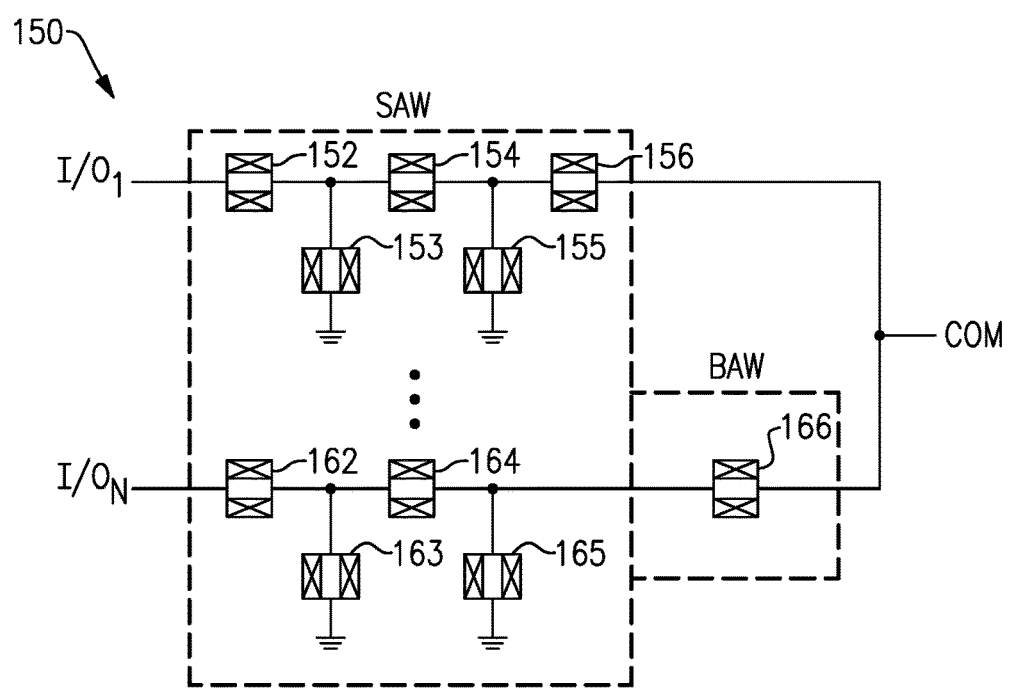
FIG. 6 is a schematic diagram of acoustic wave resonators of a multiplexer according to another embodiment.

While FIG. 2A and some other embodiments, such as FIGS. 4 to 6, illustrate example multiplexers that includes SAW resonators and BAW resonators, any suitable principles and advantages discussed herein can be implemented with two different suitable types of resonators. For instance, a filter of a multiplexer can include acoustic wave resonators of a first type and a series acoustic wave resonator of a second type coupled between the acoustic wave resonators of the first type and a common node of the multiplexer.

The second type of resonator can have lower loading loss than the first type of resonator. Such loading loss can refer to losses associated with increased insertion loss through one filter caused by unwanted signal dissipation and/or redirection by one or more of the other filters of a multiplexer.

The second type of resonator can have a higher out of band rejection than the acoustic wave resonators of the first type. The second type of resonator can have a higher out of band quality factor than the first type of resonator. For instance, the second type of resonator can have a higher quality factor in a passband of at least one other filter of the multiplexer than the acoustic wave resonators of the first type. With a higher out of band quality factor, the second type of resonator can provide more rejection out of band with less energy dissipation than the first type of resonator. In certain applications, the second type of resonator can have a higher quality factor in respective passbands of all of the other filters of the multiplexer than the acoustic wave resonators of the first type. A quality factor can represent a ratio of stored power to dissipated power. The quality factor can be frequency dependent.

The second type of acoustic wave resonator can be more expensive and achieve better out of band performance than the first type of acoustic wave resonator. By implementing an acoustic wave filter with two types of resonators, out of band performance and cost can be balanced in a solution that is relatively low cost and relatively high performance.

In the multiplexer 20 of FIG. 2A, the first type of resonator is a SAW resonator and the second type of resonator is a BAW resonator. Other example multiplexers with two different types of resonators will be described with reference to FIGS. 2B and 2C.

Figure 2B:
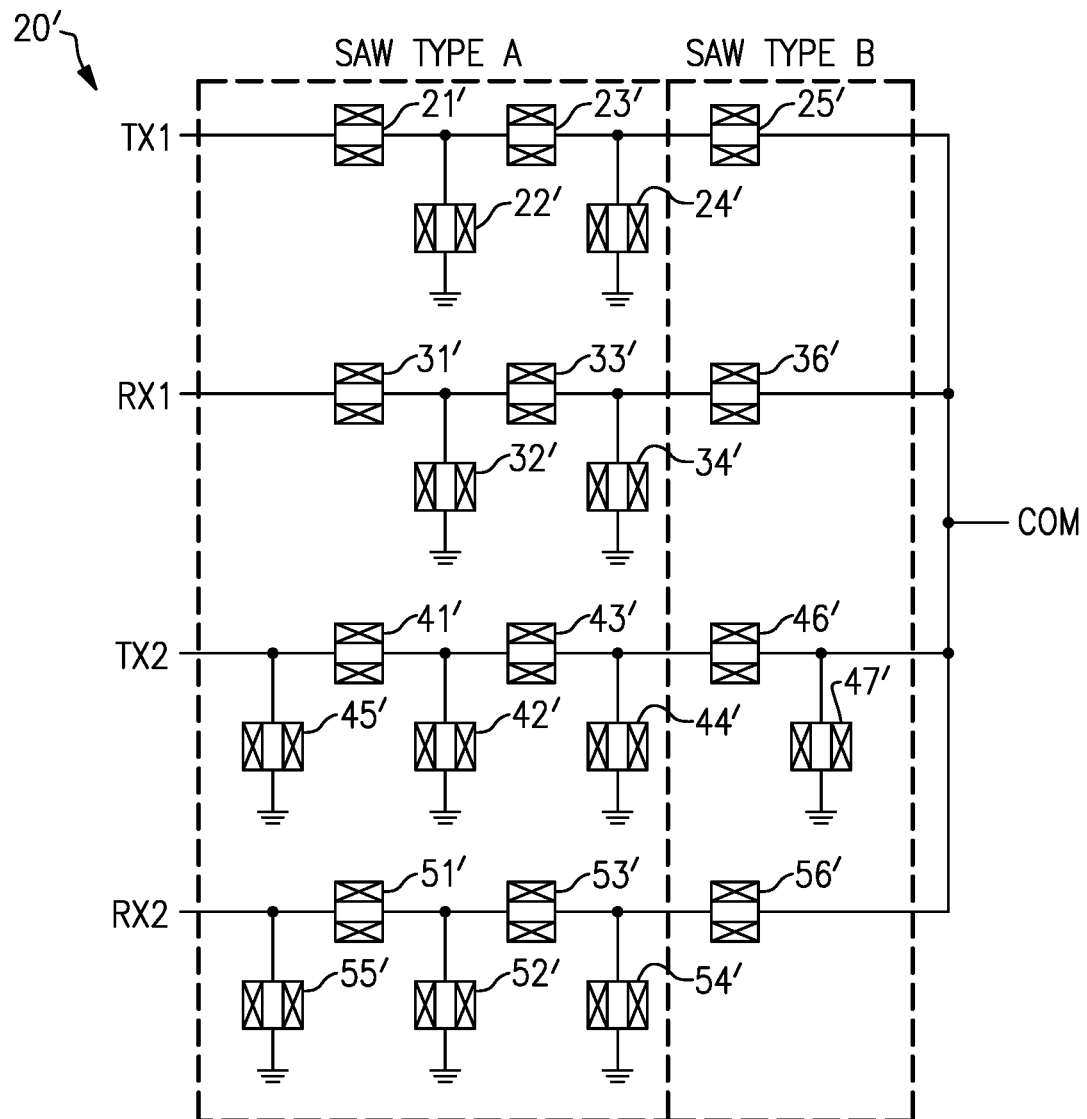
FIG. 2B is a schematic diagram of acoustic wave resonators of a quadplexer according to an embodiment.

FIG. 2B is a schematic diagram of acoustic wave resonators of a quadplexer 20' according to an embodiment. The quadplexer 20' includes two types of SAW resonators, SAW type A and SAW type B. The quadplexer 20' is similar to the quadplexer 20 of FIG. 2A, except that a second type of SAW resonators are implemented in the quadplexer 20' in place of the BAW resonators of the quadplexer 20. The second type of SAW resonator SAW type B can similar advantages over the first type of SAW resonator SAW type A as BAW resonators. For instance, the second type of SAW resonator SAW type B can have lower loading losses and/or better out of band rejection and/or higher out of band quality factor than the first type of SAW resonator SAW type A. At the same time, the second type of SAW resonators SAW type B can be more expensive to implement than the first type of SAW resonator SAW type A. Accordingly, the filter topologies shown in FIG. 2B can balance cost and performance to provide a relatively low cost and relatively high performance solution.

In some instances, the first type of SAW resonator SAW type A can be a standard SAW resonator and the second type of SAW resonator SAW type B can be a temperature compensated SAW (TCSAW) resonator. The standard SAW resonators can be non-temperature compensated. A TCSAW resonator can include a temperature compensating layer with a positive temperature coefficient of frequency. For example, a TCSAW resonator can be a standard SAW resonator plus a silicon dioxide layer over the IDT electrode.

According to certain embodiments, the second type of SAW resonator SAW type B can be a SAW resonator with characteristics that are equivalent or superior to the BAW resonators with temperature characteristics that are superior to typical BAW resonators. Such a second type of SAW resonator can have a relatively high quality factor, relatively low temperature coefficient of frequency, and relatively high heat dissipation. This second type of SAW resonator can have a multi-layer substrate that can increase quality factor and lower temperature coefficient of frequency relative to standard SAW resonators. The second SAW resonator can include an IDT electrode on a multi-layer substrate that includes a piezoelectric layer (e.g., lithium niobate (LN) or lithium tantalate (LT)) over a functional layer (e.g., $SiO_2$, SiON, or $Ta_2O_5$) over a high velocity layer (e.g., sapphire, alumina, SiN, or AlN) over a support substrate (e.g., silicon). For instance, the second type of SAW resonator can include an IDT electrode on LT/$SiO_2$/AlN/Si substrate. The second type of SAW resonator can be an Incredible High-Performance (IHP) SAW resonator from Murata Manufacturing Co., Ltd. With this second type of SAW resonator in quadplexer 20', the first type of SAW resonator in the quadplexer 20 can be a non-temperature compensated SAW resonator or a temperature compensated SAW resonator.

A first acoustic wave filter of the quadplexer 20' includes SAW resonators of the first type 21', 22', 23', and 24' and a SAW resonator of the second type 25'. A second acoustic wave filter of the quadplexer 20' includes SAW resonators of the first type 31', 32', 33', and 34' and a SAW resonator of the second type 36'. A third acoustic wave filter of the quadplexer 20' includes SAW resonators of the first type 41', 42', 43', 44', and 45' and SAW resonators of the second type 46' and 47'. A fourth acoustic wave filter of the quadplexer 20' includes SAW resonators of the first type 51', 52', 53', 54', and 55' and a SAW resonator of the second type 56'.

Figure 2C:
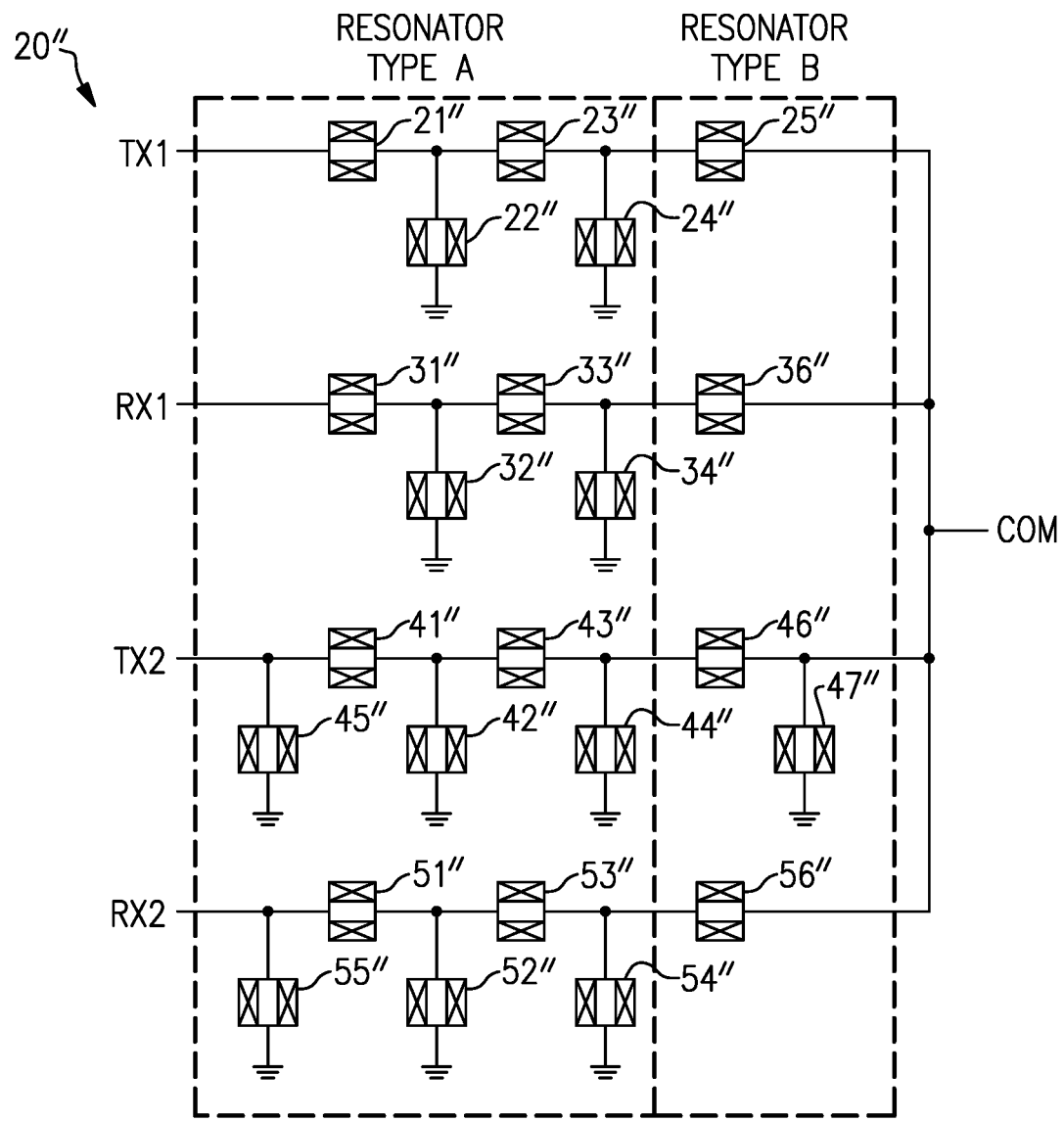
FIG. 2C is a schematic diagram of acoustic wave resonators of a quadplexer according to an embodiment.

FIG. 2C is a schematic diagram of acoustic wave resonators of a quadplexer 20'' according to an embodiment. The quadplexer 20'' includes two types of resonators, resonator type A and resonator type B. The quadplexer 20'' is similar to the quadplexer 20 of FIG. 2A and the quadplexer 20' of FIG. 2B, except that the two types of resonators of the quadplexer 20'' can be any suitable types of resonators. The second type of resonator can have similar advantages over the first type of resonator as BAW resonators have over SAW resonators. For instance, the second type of resonator can have any of the advantages discussed above related to lower loading losses, better out of band rejection, higher out of band quality factor than the first type of resonator, the like, or any suitable combination thereof. At the same time, the second type of resonator can be more expensive to implement than the first type of resonator. Accordingly, the filter topologies shown in FIG. 2C can balance cost and performance to provide a relatively low cost and relatively high performance solution.

A first filter of the quadplexer 20" includes resonators of the first type 21", 22", 23", and 24" and a resonator of the second type 25". A second filter of the quadplexer 20" includes resonators of the first type 31", 32", 33", and 34" and a resonator of the second type 36". A third filter of the quadplexer 20" includes resonators of the first type 41", 42", 43", 44", and 45" and resonators of the second type 46" and 47". A fourth filter of the quadplexer 20" includes resonators of the first type 51", 52", 53", 54", and 55" and a resonator of the second type 56". All of the illustrated resonators of the quadplexer 20" can be acoustic wave resonators.

Figure 3:
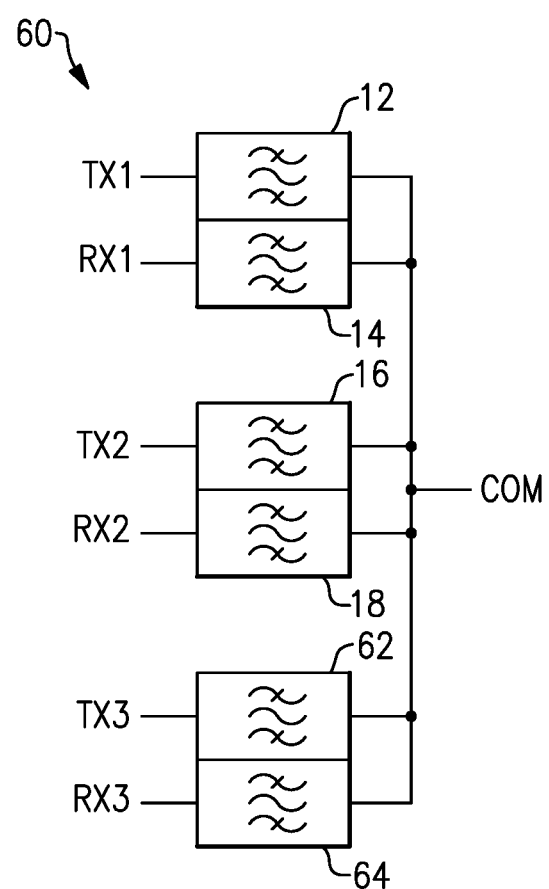
FIG. 3 is a schematic diagram of a hexaplexer.

FIG. 3 is a schematic diagram of a hexaplexer 60. The hexaplexer 60 includes six filters connected at a common node COM. As illustrated, the hexaplexer 60 includes a first transmit filter 12, a first receive filter 14, a second transmit filter 16, a second receive filter 18, a third transmit filter 62, and a third receive filter 64. Each of the filters of the hexaplexer 60 can be band pass filters as illustrated. One or more of the filters of the hexaplexer 60 can be acoustic wave filters. All of the filters of the hexaplexer 60 can be acoustic wave filters. Any of the filters of the hexaplexer 60 can include two types of acoustic wave resonators in accordance with the principles and advantages discussed herein. For instances, any of the filters of the hexaplexer 60 can include SAW resonators and one or more BAW resonators in accordance with the principles and advantages discussed herein.

FIG. 4 is a schematic diagram of acoustic wave resonators of a hexaplexer 70 according to an embodiment. The hexaplexer 70 is an example of the hexaplexer 60 of FIG. 3. As illustrated in FIG. 4, each filter of the hexaplexer 70 is implemented by acoustic wave resonators. A multiplexer can be implemented in accordance with suitable principles and advantages discussed with reference to FIG. 4. Particular filters of such a multiplexer can be implemented for design specifications for a given application. The acoustic wave filters of FIG. 4 show some examples of such filters.

A first acoustic wave filter of the hexaplexer 70 includes a BAW resonator 71 and SAW resonators 72, 73, 74, 75, 76, 77, 78, and 79. The first acoustic wave filter can be a transmit filter, such as the first transmit filter 12 of FIG. 3. SAW resonators account for ⅜ of the acoustic wave resonators of the in the first acoustic wave filter.

A second acoustic wave filter of the hexaplexer 70 includes a BAW resonator 81 and SAW resonators 82 and 83. The second acoustic wave filter can be a receive filter, such as the first receive filter 14 of FIG. 3. The illustrated SAW resonator 83 is a double mode SAW (DMS) resonator, which can also be referred to as a coupled resonator filter (CRF). A DMS resonator can be implemented in low-power filters, such as receive filters. DMS resonators typically do not handle relatively high power. Accordingly, there should be at least one series acoustic wave resonator protecting the DMS resonator from the relatively high power that is present on a common node COM, which can be an antenna node.

A third acoustic wave filter of the hexaplexer 70 includes a BAW resonator 91 and SAW resonators 92, 93, 94, 95, 96, 97, and 98. The third acoustic wave filter can be a transmit filter, such as the second transmit filter 16 of FIG. 3.

A fourth acoustic wave filter of the hexaplexer 70 includes a BAW resonator 101 and SAW resonators 102, 103, and 105. The fourth acoustic wave filter can be a receive filter, such as the second receive filter 18 of FIG. 3.

A fifth acoustic wave filter of the hexaplexer 70 includes BAW resonators 111 and 112 and SAW resonators 113, 114, 115, 116, 117, 118, and 119. The fifth acoustic wave filter can be a transmit filter, such as the third transmit filter 62 of FIG. 3. The fifth acoustic wave filter illustrates that a shunt BAW resonator and a series BAW resonator can be coupled to a common node COM of a multiplexer. The shunt BAW resonator 112 is coupled to the opposite side of the series BAW resonator 111 than the SAW resonators of the fifth acoustic wave filter.

A sixth acoustic wave filter of the hexaplexer 70 includes SAW resonators 122, 123, 124, and 125. The sixth acoustic wave filter can be a receive filter, such as the third receive filter 64 of FIG. 3. The sixth acoustic wave filter illustrates that one or more filters of a multiplexer can be implemented with only SAW resonators.

FIG. 5 is a schematic diagram of acoustic wave resonators of a multiplexer 130 according to an embodiment. A multiplexer can include any suitable number of acoustic wave filters. For example, the multiplexer can be a quadplexer with four filters, a pentaplexer with five filters, a hexaplexer with six filters, an octoplexer with eight filters, etc. In some instances, the multiplexer 130 can include 2 to 16 acoustic wave filters connected at the common node COM. The acoustic wave filters of the multiplexer 130 can include any suitable combination of receive filters and/or transmit filters. Each of the input/output (I/O) ports of the acoustic wave filters can be an input for a transmit filter or an output for a receive filter. Each of the acoustic wave filters can include SAW resonators coupled to a common node by way a series BAW resonator. For instance, the first acoustic wave filter of the multiplexer 130 includes SAW resonators 132, 133, 134, and 135 and BAW resonator 136, in which all of the SAW resonators 132, 133, 134, and 135 are coupled to the common node COM by way of the series BAW resonator 136. The N-th acoustic wave filter of the multiplexer 130 includes SAW resonators 142, 143, 144, and 145 and BAW resonator 146, in which all of the SAW resonators 142, 143, 144, and 145 are coupled to the common node COM by way of the series BAW resonator 146.

FIG. 6 is a schematic diagram of acoustic wave resonators of a multiplexer 150 according to an embodiment. The multiplexer 150 is like the multiplexer 130 of FIG. 5 except that the multiplexer 150 includes an acoustic wave filter implemented of only SAW resonators. FIG. 6 illustrates that one or more acoustic wave filters of a multiplexer can include SAW resonators and not include any BAW resonators. For instance, a first acoustic wave filter of the multiplexer 150 includes SAW resonators 152, 153, 154, 155, and 156 and does not include any BAW resonators. The multiplexer 150 also includes one or more acoustic wave filters with SAW resonators coupled to the common node by way of a series BAW resonator. For instance, the N-th acoustic wave filter of the multiplexer 150 includes SAW resonators 162, 163, 164, and 165 and BAW resonator 166, in which all of the SAW resonators 162, 163, 164, and 165 are coupled to the common node COM by way of the series BAW resonator 166.

Any suitable number of BAW resonators can be coupled between SAW resonators of a filter and a common node. For instance, a series BAW resonator and one or more other series BAW resonators and/or one or more shunt BAW resonators can be coupled between SAW resonators of a filter and the common node.

The multiplexers discussed herein can be implemented in a variety of radio frequency systems. Radio frequency signals can process signals having frequencies in a range from about 30 kHz to 300 GHz, such as in a range from about 450 MHz to 6 GHz. Some radio frequency systems that include multiplexers in accordance with the principles and advantages discussed herein are configured to process carrier aggregation signals. In radio frequency systems with carrier aggregation, multiple filters can be arranged as a multiplexer and connected to a common antenna node. Some example radio frequency systems will now be discussed in which any suitable principles and advantages of the multiplexers and/or the filters discussed herein can be implemented.

FIGS. 7, 8, 9, 10A, and 10B are schematic block diagrams of illustrative radio frequency systems according to certain embodiments. The multiplexers in these radio frequency systems can have reduced loading loss as a result of having BAW resonators coupled between SAW resonators and a common node in one or more acoustic wave filters. Implementing one or more of these acoustic wave filters with a majority of SAW resonators can also reduce costs relative to similar acoustic wave filters implemented of mostly BAW elements. The principles and advantages of filters that include SAW resonators and one or more BAW resonators can be applied to filters with filters that include any two different types of acoustic wave resonators. Each of the filters of the multiplexers of the radio frequency systems discussed herein can be band pass filters.

Figure 7:
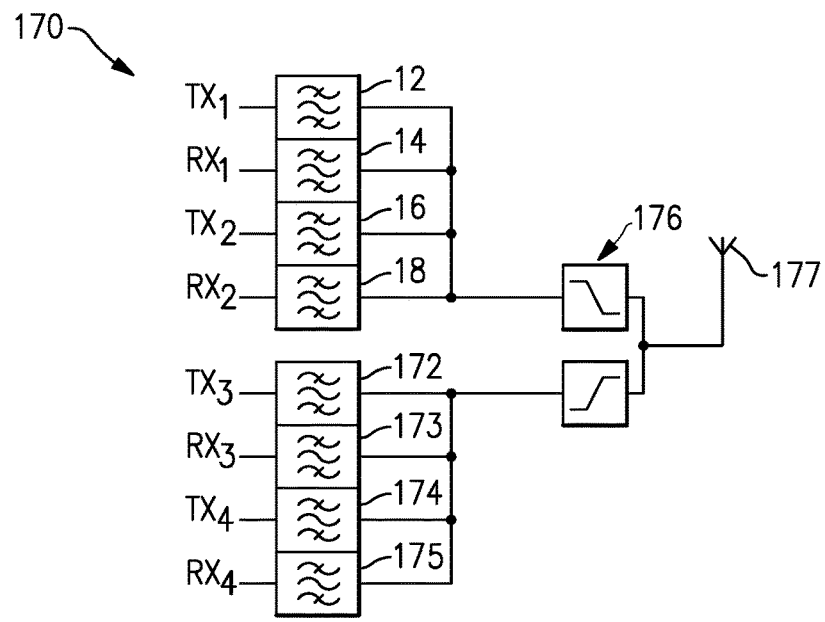
FIG. 7 is a schematic diagram of a radio frequency system that includes quadplexers coupled to an antenna by way of a diplexer.

FIG. 7 is a schematic diagram of a radio frequency system 170 that includes quadplexers coupled to an antenna 177 by way of a diplexer 176. In FIG. 7, a first quadplexer includes acoustic wave filters 12, 14, 16, and 18. In FIG. 7, a second quadplexer includes acoustic wave filters 172, 173, 174, and 175. The diplexer 176 can serve to frequency multiplex radio frequency signals propagating between the illustrated quadplexers and the antenna 177.

Figure 8:
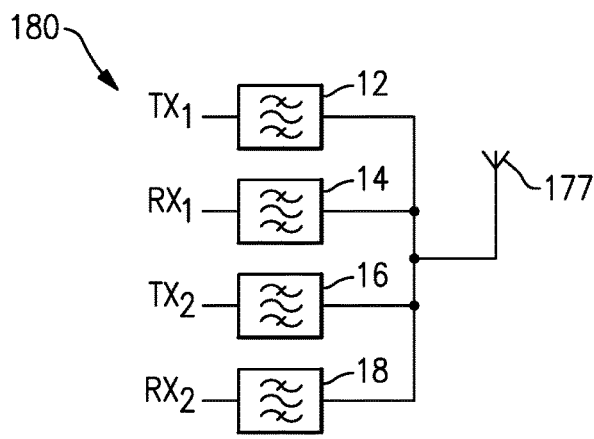
FIG. 8 is a schematic diagram of a radio frequency system that includes a quadplexer coupled to an antenna.

FIG. 8 is a schematic diagram of a radio frequency system 180 that includes a quadplexer coupled to an antenna 177. FIG. 8 illustrates that a multiplexer can be connected to an antenna without an intervening frequency multiplexing circuit (e.g., a diplexer or a triplexer) in some applications. For instance, when a carrier aggregation signal includes two carriers that are relatively close in frequency, a diplexer or a triplexer can be relatively difficult and/or expensive to implement and/or have relatively high loss. In such circumstances, filters can be connected together at a common node as a multiplexer. As one example, such a multiplexer can be a quadplexer with transmit and receive filters for Band 25 and Band 66. A multiplexer can be connected to an antenna without an intervening switch or frequency multiplexing circuit in certain applications, as shown in FIG. 8. For instance, a mobile phone configured for wireless communication of a carrier aggregation signal with only two carrier aggregation bands can include a multiplexer having a multiplexer connected to an antenna without any intervening switch or frequency multiplexing circuit.

Figure 9:
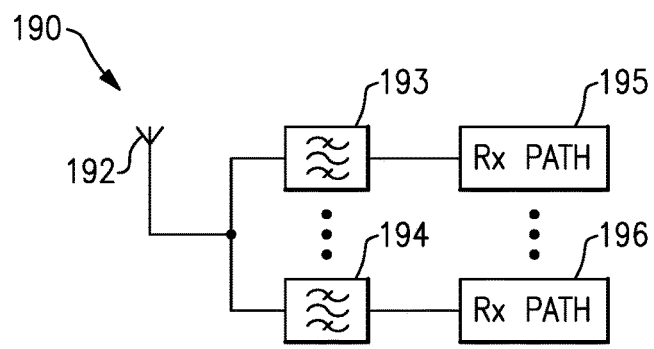
FIG. 9 is a schematic diagram of a radio frequency system that includes an antenna coupled to receive paths by way of a multiplexer.

FIG. 9 is a schematic diagram of a radio frequency system 190 that includes an antenna 192 coupled to receive paths by way of a multiplexer. In some instances, a radio can be implemented for diversity receive operations. A diversity antenna, such as the illustrated antenna 192, can provide a received radio frequency signal to several receive paths. A multiplexer can be coupled between a plurality of receive paths and the diversity antenna. As shown in FIG. 9, a multiplexer (e.g., a quadplexer) including receive filters 193 and 194 can be coupled between receive paths 195 and 196, respectively, and the antenna 192. Any suitable number of receive paths and corresponding receive filters can be implemented for a particular implementation. For instance, 4 or more receive filters can be included in a multiplexer and respective receive paths in some instances. In some embodiments (not illustrated), a switch can be coupled between a multiplexer and a diversity antenna and/or a switch can be coupled between receive paths and a receive filter of the multiplexer.

Figure 10A:
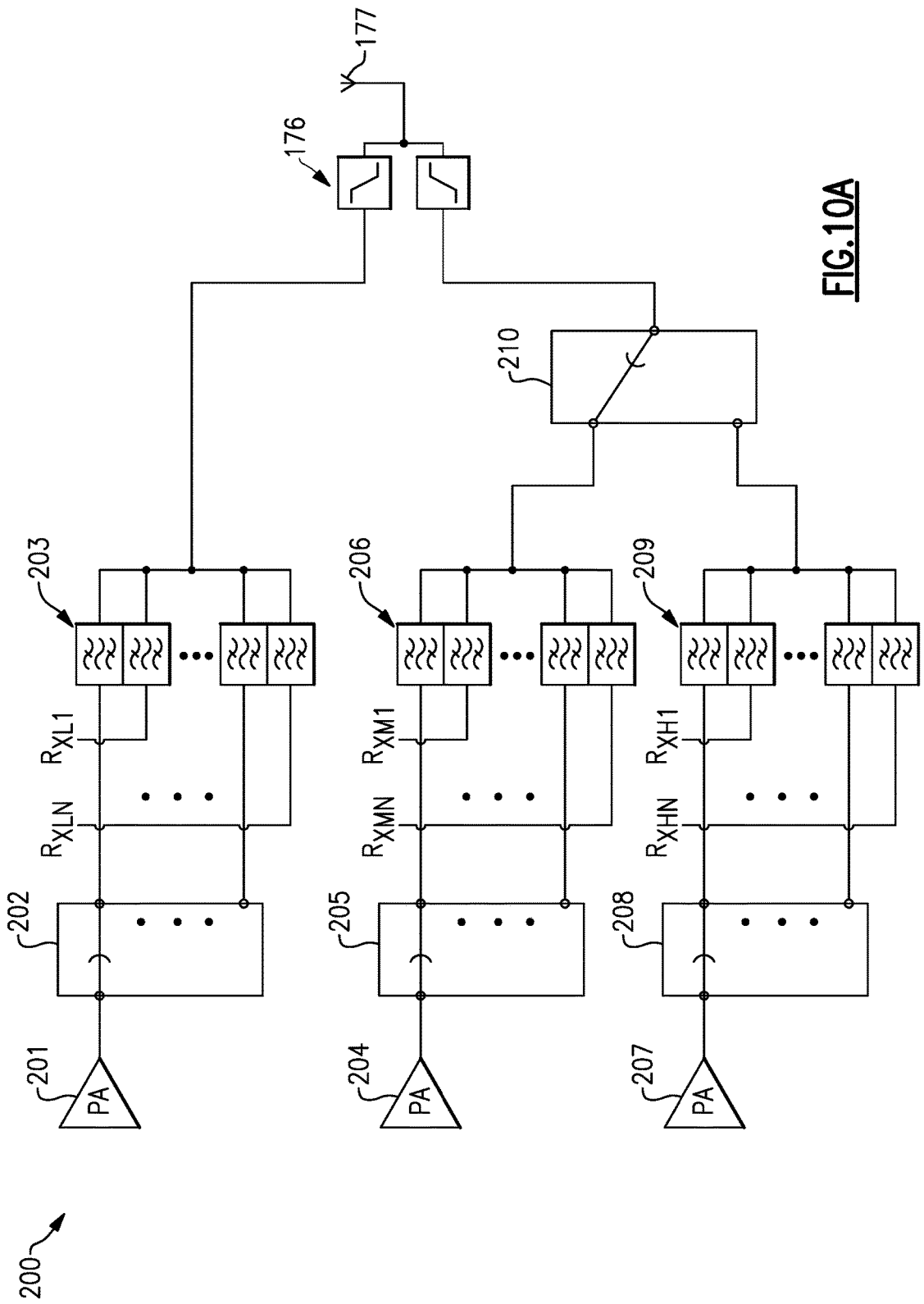
FIG. 10A is a schematic diagram of a radio frequency system that includes multiplexers in signal paths between power amplifiers and an antenna.

FIG. 10A is a schematic diagram of a radio frequency system 200 that includes multiplexers in signal paths between power amplifiers and an antenna 177. The illustrated radio frequency system 200 includes a low band path, a medium band path, and a high band path. In certain applications, a low band path can process radio frequency signals having a frequency of less than 1 GHz, a medium band path can process radio frequency signals having a frequency between 1 GHz and 2.2 GHz, and a high band path can process radio frequency signals having a frequency above 2.2 GHz.

A frequency multiplexing circuit, such as a diplexer 176, can be included between signal paths and the antenna 177. Such a frequency multiplexing circuit can serve as a frequency splitter for receive paths and a frequency combiner for transmit paths. The diplexer 176 can frequency multiplex radio frequency signals that are relatively far away in frequency. The diplexer 176 can be implemented with passive circuit elements having a relatively low loss. The diplexer 176 can combine (for transmit) and separate (for receive) carrier aggregation signals.

As illustrated, the low band path includes a power amplifier 201 configured to amplify a low band radio frequency signal, a band select switch 202, and a multiplexer 203. The band select switch 202 can electrically connect the output of the power amplifier 201 to a selected transmit filter of the multiplexer 203. The selected transmit filter can be a band pass filter with a pass band corresponding to a frequency of an output signal of the power amplifier 201. The multiplexer 203 can include any suitable number of transmit filters and any suitable number of receive filters. The multiplexer 203 can have the same number of transmit filters as receive filters in certain applications. In some instances, the multiplexer 203 can have a different number of transmit filters than receive filters.

As illustrated in FIG. 10A, the medium band path includes a power amplifier 204 configured to amplify a medium band radio frequency signal, a band select switch 205, and a multiplexer 206. The band select switch 205 can electrically connect the output of the power amplifier 204 to a selected transmit filter of the multiplexer 206. The selected transmit filter can be a band pass filter with a pass band corresponding to a frequency of an output signal of the power amplifier 204. The multiplexer 206 can include any suitable number of transmit filters and any suitable number of receive filters. The multiplexer 206 can have the same number of transmit filters as receive filters in certain applications. In some instances, the multiplexer 206 can have a different number of transmit filters than receive filters.

In the illustrated radio frequency system 200, the high band path includes a power amplifier 207 configured to amplify a high band radio frequency signal, a band select switch 208, and a multiplexer 209. The band select switch 208 can electrically connect the output of the power amplifier 207 to a selected transmit filter of the multiplexer 209. The selected transmit filter can be a band pass filter with pass band corresponding to a frequency of an output signal of the power amplifier 207. The multiplexer 209 can include any suitable number of transmit filters and any suitable number of receive filters. The multiplexer 209 can have the same number of transmit filters as receive filters in certain applications. In some instances, the multiplexer 209 can have a different number of transmit filters than receive filters.

A select switch 210 can selectively provide a radio frequency signal from the medium band path or the high band path to the diplexer 176. Accordingly, the radio frequency system 200 can process carrier aggregation signals with either a low band and high band combination or a low band and medium band combination.

Figure 10B:
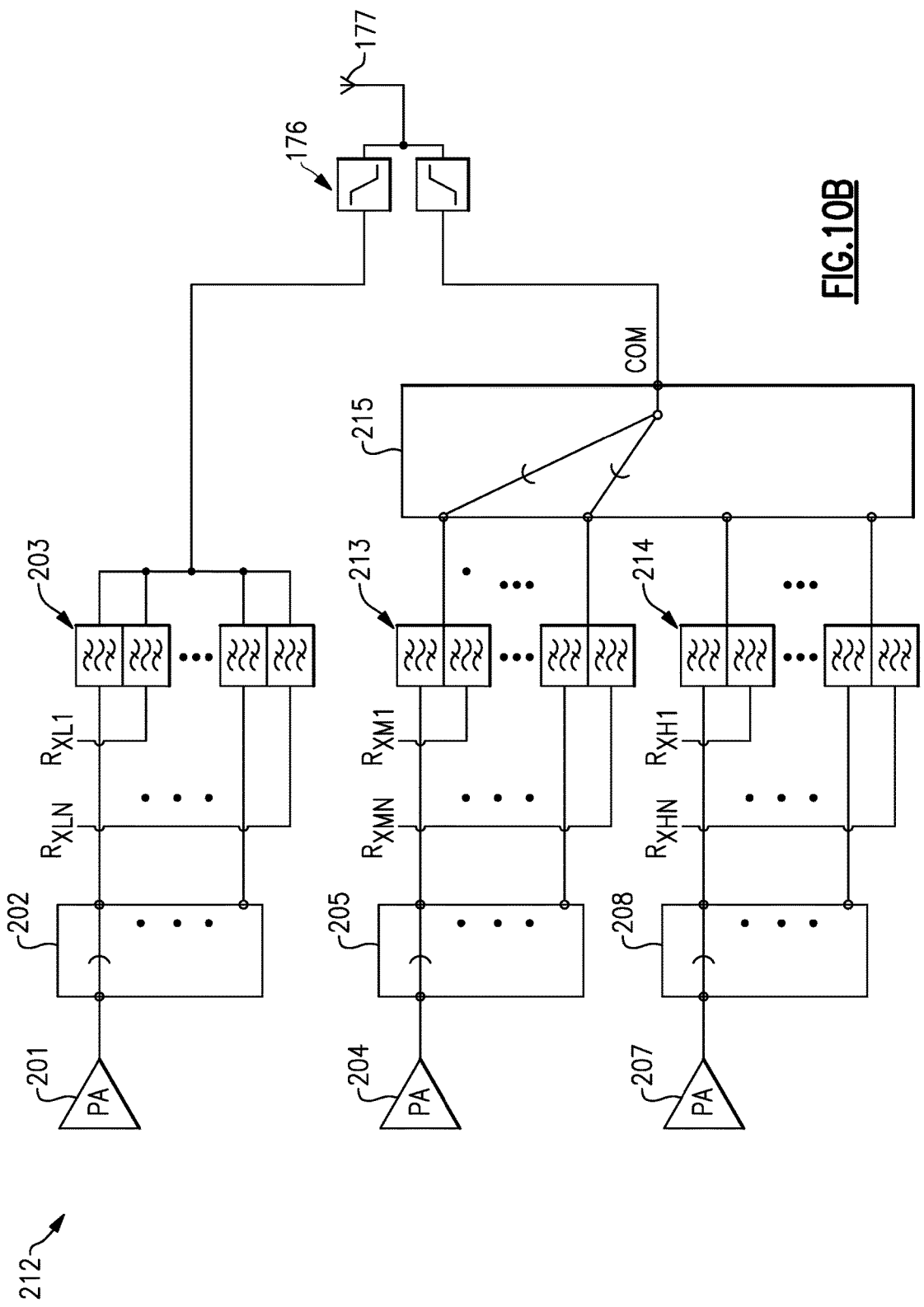
FIG. 10B is a schematic diagram of another radio frequency system that includes multiplexers in signal paths between power amplifiers and an antenna.

FIG. 10B is a schematic diagram of a radio frequency system 212 that includes multiplexers in signal paths between power amplifiers and an antenna. The radio frequency system 212 is like the radio frequency system 200 of FIG. 10A, except that the radio frequency system 212 includes switch-plexing features. Switch-plexing can be implemented in accordance with any suitable principles and advantages discussed herein.

Switch-plexing can implement on-demand multiplexing. Some radio frequency systems can operate in a single carrier mode for a majority of time (e.g., about 95% of the time) and in a carrier aggregation mode for a minority of the time (e.g., about 5% of the time). Switch-plexing can reduce loading in a single carrier mode in which the radio frequency system can operate for the majority of the time relative to a multiplexer that includes filters having a fixed connection at a common node. Such a reduction in loading can be more significant when there are a larger number of filters included in multiplexer.

In the illustrated radio frequency system 212, multiplexers 213 and 214 are coupled to a diplexer 176 by way of a switch 215. The switch 215 is configured as a multi-close switch that can have two or more throws active concurrently. Having multiple throws of the switch 215 active concurrently can enable transmission and/or reception of carrier aggregation signals. The switch 215 can also have a single throw active during a single carrier mode. As illustrated, the multiplexer 213 includes a plurality of duplexers coupled to separate throws of the switch 215. Similarly, the illustrated multiplexer 214 includes a plurality of duplexers coupled to separate throws of the switch 215. Alternatively, instead of duplexers being coupled to each throw of the switch 215 as illustrated in FIG. 10B, one or more individual filters of a multiplexer can be coupled to a dedicated throw of a switch coupled between the multiplexer and a common node. For instance, in some applications, such a switch could have twice as many throws as the illustrated switch 215.

The switch 215 is coupled between filters of the multiplexers 213 and 214, respectively, and a common node COM. FIG. 10B illustrates that less than all of the filters of a multiplexer can be electrically connected to the common node concurrently.

In some instances, two or more throws of a switch coupled between a power amplifier and a multiplexer can be active concurrently. For example, in the radio frequency system 212, two or more throws of the band select switch 205 and/or the band select switch 208 can be active concurrently in certain embodiments. When multiple throws of a switch electrically connect filters of a multiplexer to a power amplifier concurrently, loading losses can occur. Accordingly, one or more acoustic wave filters of the multiplexer can include a series bulk acoustic wave resonator coupled between surface acoustic wave resonators and the power amplifier.

Figure 10C:
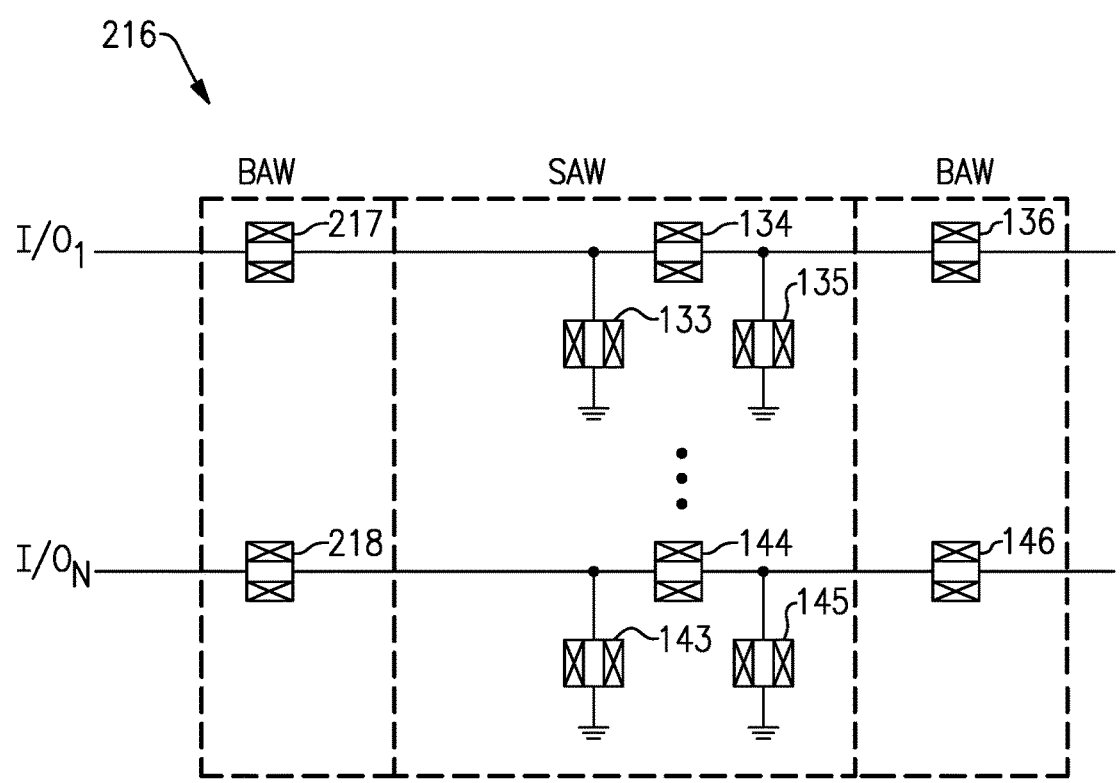
FIG. 10C is a schematic diagram of acoustic wave resonators of a multiplexer according to an embodiment.

FIG. 10C is a schematic diagram of acoustic wave resonators of a multiplexer 216 according to an embodiment. The multiplexer 216 is like the multiplexer 130 of FIG. 5, except that SAW resonators 132 and 142 are replaced by BAW resonators 217 and 218, respectively. The BAW resonators 217 and 218 can reduce loading relative to SAW resonators 132 and 142 in applications in which ports I/O$_1$ and I/O$_N$ can be electrically connected to each other, for example, by multiple throws of a multi-throw switch being active concurrently. As an illustrative example, the BAW resonators 217 and 218 of FIG. 10C can reduce loading relative to SAW resonators 132 and 142 of FIG. 5 when two throws of the band select switch 205 of FIG. 10B electrically connect the BAW resonators 217 and 218 to each other. Any suitable number of BAW resonators can be coupled between SAW resonators of a filter and an I/O port (e.g., an input port for a transmit filter). For instance, a series BAW resonator and one or more other series BAW resonators and/or one or more shunt BAW resonators can be coupled between SAW resonators of a filter and the I/O port. In some instances, a series BAW resonator is coupled between an I/O port and surface acoustic wave resonators of only transmit filters of a multiplexer and not of receive filters of the multiplexer. In some instances, a series BAW resonator is coupled between an I/O port and surface acoustic wave resonators of only subset transmit filters of a multiplexer and not of receive filters and one or more other transmit filters of the multiplexer.

Figure 11A:
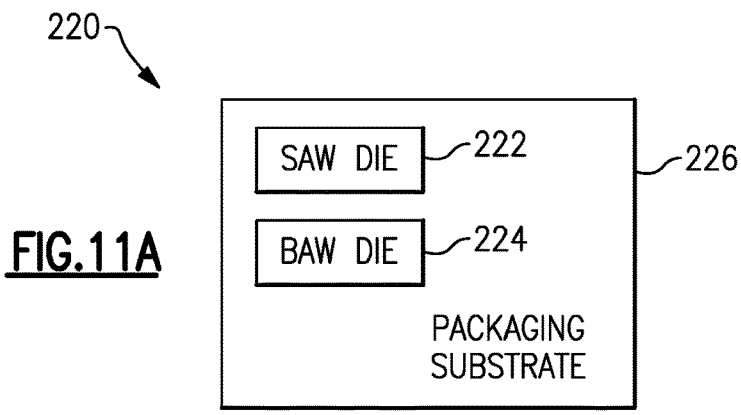
FIG. 11A is a block diagram that illustrates different die that include acoustic wave resonators of filters according to embodiments discussed herein.

FIG. 11A is a block diagram of a filter assembly 220 with different die that include acoustic wave resonators of one or more filters according to embodiments discussed herein. As illustrated, the filter assembly 220 includes a SAW die 222 and a BAW die 224 that are included on a common substrate 226. One or more acoustic wave filters can include resonators implemented on the SAW die 222 and the BAW die 224. The BAW die 224 can be an FBAR die according to certain embodiments. The substrate 226 can be a laminate substrate or any other suitable packaging substrate. Resonators of one or more acoustic wave filters of a multiplexer can be implemented on the SAW die 222 and the BAW die 224. Resonators of one or more multiplexers can be implemented on the SAW die 222 and the BAW die 224. For example, resonators for multiple multiplexers can be implemented on the SAW die 224 and the BAW die 224.

As one example, a quadplexer can be implemented with duplexers for Band 25 and Band 66 electrically connected at a common node. In some designs, Band 25 transmit and receive filters can be implemented by BAW resonators to meet performance specifications and Band 66 transmit and receive filters have been implemented by SAW resonators to save on expenses. In accordance with the principles and advantages discussed herein, the majority of resonators (e.g., at least 70%, at least 80%, or more) in Band 66 transmit and receive filters can be implemented using SAW resonators of the SAW die 222. These SAW resonators can be coupled to the common node by way of a series BAW resonator on the BAW die 224. The Band 66 transmit and receive filters can be implemented by resonators of the BAW die 224. In some instances, one or more of the resonators of the Band 66 transmit and/or receive filters can be implemented on the SAW die 222.

As one more example, according to certain embodiments, a duplexer can include a transmit filter that includes at least one resonator on the BAW die 224 and resonators on the SAW die 222 and a receive filter that includes at least one resonator on the BAW die 224 and resonators on the SAW die 222.

According to certain embodiments, one or more acoustic wave filters of a multiplexer can be implemented with resonators on both the SAW die 222 and the BAW die 224 and one or more acoustic wave filters of the same multiplexer can be implemented with resonators on only one of the SAW die 222 or the BAW die 224.

In some embodiments, different SAW die and/or different BAW die can be implemented for different frequency ranges. Such for different frequency ranges can include piezoelectric layers and/or metallization layers of different thicknesses.

Figure 11B:
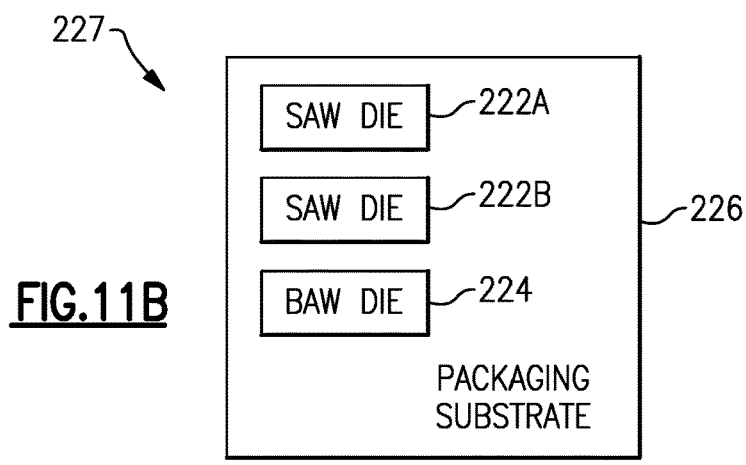
FIG. 11B is a block diagram that illustrates different die that include acoustic wave resonators of filters according to embodiments discussed herein.

FIG. 11B is a block diagram of a filter assembly 227 with different die that include acoustic wave resonators of filters according to embodiments discussed herein. As illustrated, the filter assembly 227 includes SAW die 222A and 222B and a BAW die 224 that are included on a common substrate 226. A multiplexer can include acoustic wave filters that include resonators implemented on a first SAW die 222A and the BAW die 224. The multiplexer can also include other acoustic wave filters that include resonators implemented on a second SAW die 222B and the BAW die 224. The different SAW die 222A and 222B can implement SAW resonators for acoustic wave filters arranged to filter radio frequency signals within different defined frequency ranges. The multiplexer 20 of FIG. 2A can be implemented by the filter assembly 227. For example, SAW resonators of the first transmit filter and the first receiver of the multiplexer 20 can be implemented on the first SAW die 222A, SAW resonators of the second transmit filter and the second receive filter of the multiplexer 20 can be implemented on the second SAW die 222B, and the BAW resonators of each of the filters of the multiplexer 20 can be implemented on the BAW die 224. In some other instances (not illustrated), BAW resonators of the multiplexer 20 can be implemented on two or more BAW die.

Figure 11C:
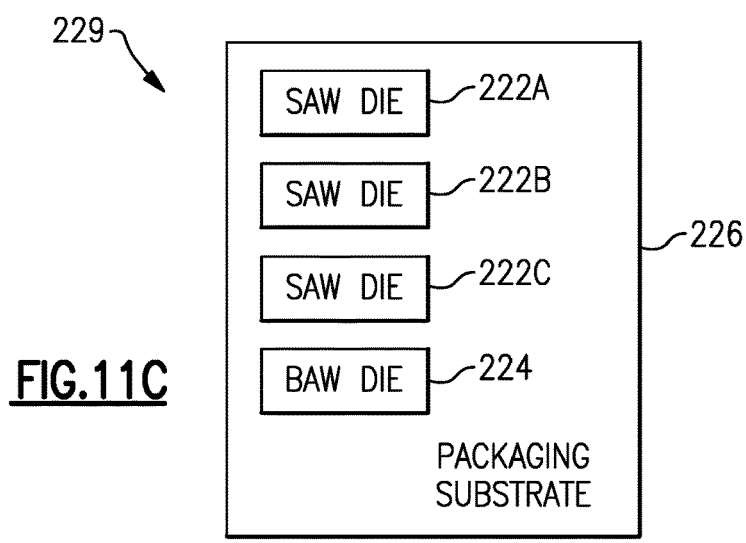
FIG. 11C is a block diagram that illustrates different die that include acoustic wave resonators of filters according to embodiments discussed herein.

FIG. 11C is a block diagram of a filter assembly 229 with different die that include acoustic wave resonators of filters according to embodiments discussed herein. As illustrated, the filter assembly 229 includes a SAW die 222A, 222B, and 222C and a BAW die 224 that are included on a common substrate 226. A multiplexer can include acoustic wave filters that include resonators implemented on a first SAW die 222A and the BAW die 224. The multiplexer can also include other acoustic wave filters that include resonators implemented on a second SAW die 222B and the BAW die 224. The multiplexer can further include additional acoustic wave filters that include resonators implemented on a third SAW die 222C and the BAW die 224. The different SAW die 222A, 222B, and 222C can implement SAW resonators for acoustic wave filters arranged to filter radio frequency signals within different defined frequency ranges.

The multiplexer 70 of FIG. 4 can be implemented by the filter assembly 229. For example, SAW resonators of the first transmit filter and the first receiver of the multiplexer 70 can be implemented on the first SAW die 222A, SAW resonators of the second transmit filter and the second receive filter of the multiplexer 70 can be implemented on the second SAW die 222B, SAW resonators of the third transmit filter and the third receive filter of the multiplexer 70 can be implemented on the third SAW die 222C, and the BAW resonators of the multiplexer 70 can be implemented on the BAW die 224. In some other instances (not illustrated), BAW resonators of the multiplexer 70 can be implemented on two or more BAW die.

The filters and multiplexers discussed herein can be implemented in a variety of packaged modules. Some example packaged modules will now be discussed in which any suitable principles and advantages of the multiplexers and/or the filters discussed herein can be implemented.

Figure 12:
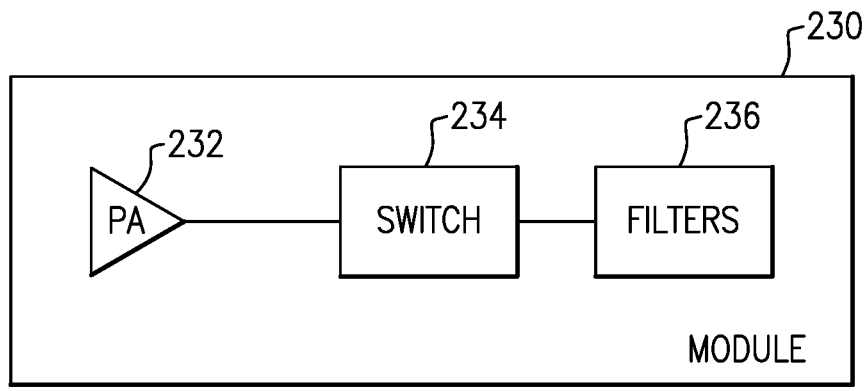
FIG. 12 is a schematic block diagram of a module that includes a power amplifier, a switch, and filters in accordance with one or more embodiments.
Figure 13:
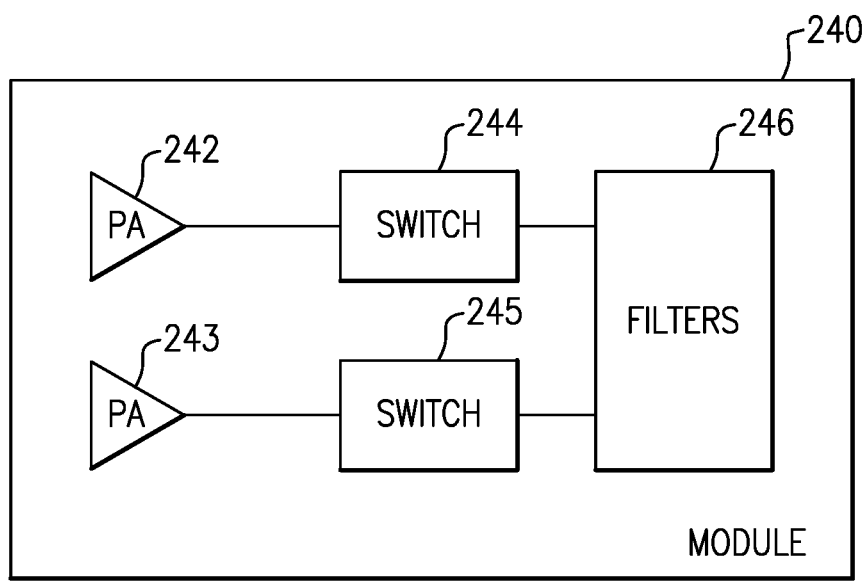
FIG. 13 is a schematic block diagram of a module that includes power amplifiers, switches, and filters in accordance with one or more embodiments.
Figure 14:
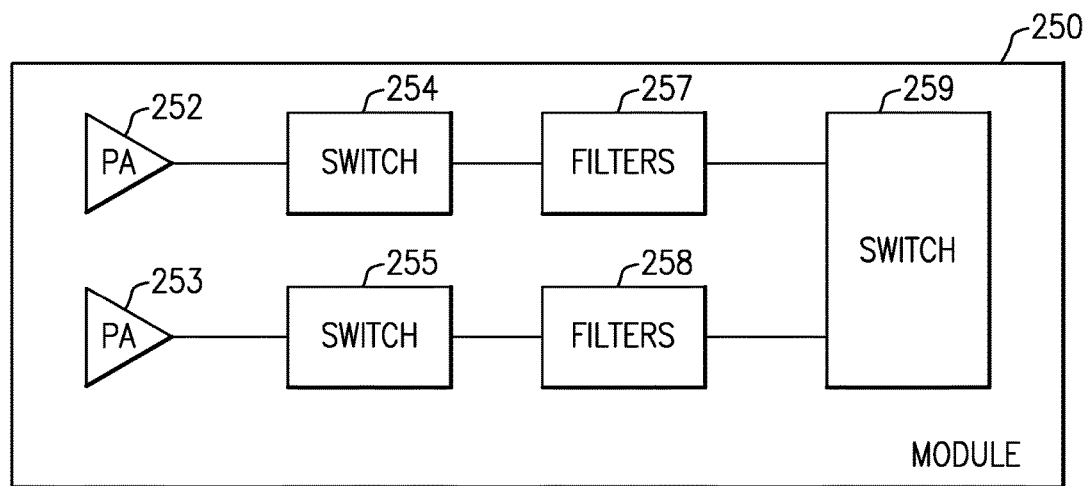
FIG. 14 is a schematic block diagram of a module that includes power amplifiers, switches, filters in accordance with one or more embodiments, and an antenna switch.

FIGS. 12, 13, and 14 are schematic block diagrams of illustrative packaged modules according to certain embodiments.

FIG. 12 is a schematic block diagram of a module 230 that includes a power amplifier 232, a switch 234, and filters 236 in accordance with one or more embodiments. The module 230 can include a package that encloses the illustrated elements. The power amplifier 232, the switch 234, and the filters 236 can be disposed on a common packaging substrate. The packaging substrate can be a laminate substrate, for example. The switch 234 can be a multi-throw radio frequency switch. The switch 234 can electrically couple an output of the power amplifier 232 to a selected filter of the filters 236. The filters 236 can include any suitable number of acoustic wave filters configured as a multiplexer. The acoustic wave filters of the filters 236 can be implemented in accordance with any suitable principles and advantages discussed herein. The filters 236 can include one or more SAW die and one or more BAW die.

FIG. 13 is a schematic block diagram of a module 240 that includes power amplifiers 242 and 243, switches 244 and 245, and filters 246 in accordance with one or more embodiments. The module 240 is like the module 230 of FIG. 12, except that the module 240 includes an addition power amplifier 243 and an additional switch 245 and the filters 246 are arranged as one or more multiplexers for the signals paths associated with the power amplifiers.

FIG. 14 is a schematic block diagram of a module 250 that includes power amplifiers 252 and 253, switches 254 and 255, and filters 257 and 258 in accordance with one or more embodiments, and an antenna switch 259. The module 250 is like the module 240 of FIG. 13, except the module 250 includes an antenna switch 259 arranged to selectively couple a signal from the filters 257 or the filters 258 to an antenna node. The filters 257 and 258 are arranged as separate multiplexers in FIG. 14.

Figure 15:
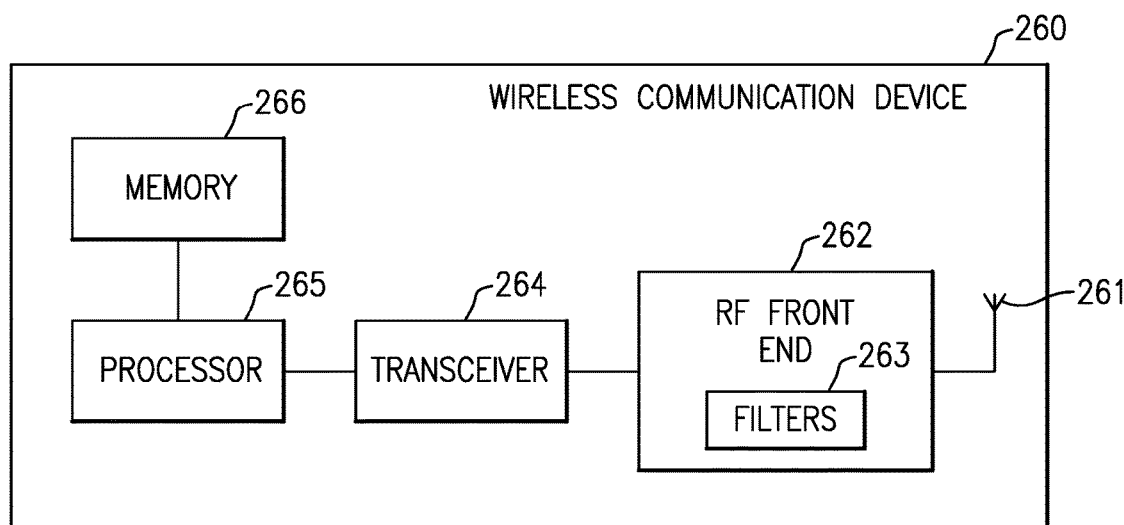
FIG. 15 is a schematic block diagram of a wireless communication device that includes filters in accordance with one or more embodiments.

FIG. 15 is a schematic block diagram of a wireless communication device 260 that includes filters 263 in accordance with one or more embodiments. The wireless communication device 260 can be any suitable wireless communication device. For instance, a wireless communication device 260 can be a mobile phone, such as a smart phone. As illustrated, the wireless communication device 260 includes an antenna 261, an RF front end 262, an RF transceiver 264, a processor 265, and a memory 266. The antenna 261 can transmit RF signals provided by the RF front end 262. The antenna 261 can provide received RF signals to the RF front end 262 for processing.

The RF front end 262 can include one or more power amplifiers, one or more low noise amplifiers, RF switches, receive filters, transmit filters, duplex filters, or any combination thereof. The RF front end 262 can transmit and receive RF signals associated with any suitable communication standards. Any of the acoustic wave filters and/or multiplexers discussed herein can be implemented by the filters 263 of the RF front end 262.

The RF transceiver 264 can provide RF signals to the RF front end 262 for amplification and/or other processing. The RF transceiver 264 can also process an RF signal provided by a low noise amplifier of the RF front end 262. The RF transceiver 264 is in communication with the processor 265. The processor 265 can be a baseband processor. The processor 265 can provide any suitable base band processing functions for the wireless communication device 260. The memory 266 can be accessed by the processor 265. The memory 266 can store any suitable data for the wireless communication device 260.

Some of the embodiments described above have provided examples in connection with mobile devices such as cellular handsets. However, the principles and advantages of the embodiments can be used for any other systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as acoustic wave resonator die and/or semiconductor die and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A filter assembly comprising:
a first acoustic wave filter having a passband and being coupled to a common node; and
a second acoustic wave filter coupled to the common node, the second acoustic wave filter including acoustic wave resonators of a first type and a series acoustic wave resonator of a second type coupled between the acoustic wave resonators of the first type and the common node, the series acoustic wave resonator of the second type having a higher quality factor in the passband of the first acoustic wave filter than the acoustic wave resonators of the first type, and the acoustic wave resonators of the first type of the second acoustic wave filter constitute at least 70% of resonators of the second acoustic wave filter.

2. The filter assembly of claim 1 wherein the acoustic wave resonators of the first type are surface acoustic wave resonators and the series acoustic wave resonator of the second type is a bulk acoustic wave resonator.

3. The filter assembly of claim 1 wherein the first acoustic wave filter includes additional acoustic wave resonators of the first type and an additional series acoustic wave resonator of the second type coupled between the additional acoustic wave resonators of the first type and the common node.

4. The filter assembly of claim 1 wherein at least two of the acoustic wave resonators of the first type are in series with the series acoustic wave resonator of the second type.

5. The filter assembly of claim 1 further comprising a third acoustic wave filter coupled to the common node and a fourth acoustic wave filter coupled to the common node.

6. A filter assembly comprising:
a first acoustic wave filter having a first passband and being coupled to a common node;
a second acoustic wave filter coupled to the common node, the second acoustic wave filter including acoustic wave resonators of a first type and a series acoustic wave resonator of a second type coupled between the acoustic wave resonators of the first type and the common node;
a third acoustic wave filter having a third passband and being coupled to the common node; and a fourth acoustic wave filter having a fourth passband and being coupled to the common node,
the series acoustic wave resonator of the second type having a higher quality factor in the first, third, and fourth passbands than the acoustic wave resonators of the first type.

7. The filter assembly of claim 6 wherein the acoustic wave resonators of the first type are surface acoustic wave resonators and the series acoustic wave resonator of the second type is a bulk acoustic wave resonator.

8. The filter assembly of claim 6 wherein the filter assembly includes a first die that includes the acoustic wave resonators of the first type and a second die that includes the series acoustic wave resonator of the second type.

9. A multiplexer with acoustic wave filters, the multiplexer comprising:
a first acoustic wave filter coupled to a common node, the first acoustic wave filter including acoustic wave resonators of a first type and a series acoustic wave resonator of a second type coupled between the acoustic wave resonators of the first type and the common node, the acoustic wave resonators of the first type being non-temperature compensated surface acoustic wave resonators and the series acoustic wave resonator of the second type being a temperature compensated surface acoustic wave resonator; and
three other acoustic wave filters coupled to the common node and each having a respective pass band, the series acoustic wave resonator of the second type having a higher quality factor in each of the respective passbands of the three other acoustic wave filters than the acoustic wave resonators of the first type.

10. The multiplexer of claim 9 further comprising an additional acoustic wave filter coupled to the common node.

11. The multiplexer of claim 9 wherein at least one of the three other acoustic wave filters includes second acoustic wave resonators of the first type and a second series acoustic wave resonator of the second type coupled between the second acoustic wave resonators of the first type and the common node.

12. A method of processing a carrier aggregation signal, the method comprising:
filtering the carrier aggregation signal with a first acoustic wave filter that is coupled to an antenna port and has a first passband, the carrier aggregation signal including a first radio frequency carrier in the first passband and a second radio frequency carrier in a second passband; and
filtering the carrier aggregation signal with a second acoustic wave filter that is coupled to the antenna port and has the second passband, the second acoustic wave filter including acoustic wave resonators of a first type and a series acoustic wave resonator of a second type coupled between the acoustic wave resonators of the first type and the antenna port, the series acoustic wave resonator of the second type having a lower loading loss than the acoustic wave resonators of the first type, and the acoustic wave resonators of the first type being on a different die than the series acoustic wave resonator of the second type.

13. The method of claim 12 further comprising coupling the first acoustic wave filter and the second acoustic wave filter to the common node by way of a multi-throw switch.

14. The method of claim 12 wherein the acoustic wave resonators of the first type are surface acoustic wave resonators and the series acoustic wave resonator of the second type is a bulk acoustic wave resonator.

15. The method of claim 12 further comprising receiving the carrier aggregation signal from an antenna coupled to the antenna port.

16. The method of claim 12 further comprising transmitting the carrier aggregation signal through an antenna coupled to the antenna port.

17. A method of processing a carrier aggregation signal, the method comprising:
filtering the carrier aggregation signal with a first acoustic wave filter that is coupled to an antenna port and has a first passband, the carrier aggregation signal including a first radio frequency carrier in the first passband and a second radio frequency carrier in a second passband; and
filtering the carrier aggregation signal with a second acoustic wave filter that is coupled to the antenna port and has the second passband, the second acoustic wave filter including acoustic wave resonators of a first type and a series acoustic wave resonator of a second type coupled between the acoustic wave resonators of the first type and the antenna port, the series acoustic wave resonator of the second type having a lower loading loss than the acoustic wave resonators of the first type, the acoustic wave resonators of the first type being non-temperature compensated surface acoustic wave resonators and the series acoustic wave resonator of the second type being a temperature compensated surface acoustic wave resonator.

18. A filter assembly comprising:
a first acoustic wave filter having a passband and being coupled to a common node; and
a second acoustic wave filter coupled to the common node, the second acoustic wave filter including acoustic wave resonators of a first type and a series acoustic wave resonator of a second type coupled between the acoustic wave resonators of the first type and the common node, the series acoustic wave resonator of the second type having a higher quality factor in the passband of the first acoustic wave filter than the acoustic wave resonators of the first type, the filter assembly including a first die that includes the acoustic wave resonators of the first type and a second die that includes the series acoustic wave resonator of the second type.

19. The filter assembly of claim 18 wherein the first acoustic wave filter includes additional acoustic wave resonators of the first type and an additional series acoustic wave resonator of the second type coupled between the additional acoustic wave resonators of the first type and the common node.

20. The filter assembly of claim 18 wherein the acoustic wave resonators of the first type of the second acoustic wave filter constitute at least 70% of resonators of the second acoustic wave filter.

21. The filter assembly of claim 18 wherein the acoustic wave resonators of the first type are surface acoustic wave resonators and the series acoustic wave resonator of the second type is a bulk acoustic wave resonator.

22. A filter assembly comprising:
a first acoustic wave filter having a passband and being coupled to a common node; and
a second acoustic wave filter coupled to the common node, the second acoustic wave filter including acoustic wave resonators of a first type and a series acoustic wave resonator of a second type coupled between the acoustic wave resonators of the first type and the common node, the series acoustic wave resonator of the second type having a higher quality factor in the passband of the first acoustic wave filter than the acoustic wave resonators of the first type, the acoustic wave resonators of the first type being non-temperature compensated surface acoustic wave resonators and the series acoustic wave resonator of the second type being a temperature compensated surface acoustic wave resonator.

23. The filter assembly of claim 22 wherein the second acoustic wave filter includes a shunt acoustic wave resonator of the second type, and the series acoustic wave resonator of the second type coupled between the shunt acoustic wave resonator of the second type and the acoustic wave resonators of the first type.

24. The filter assembly of claim 22 wherein the acoustic wave resonators of the first type of the second acoustic wave filter constitute at least 70% of resonators of the second acoustic wave filter.

* * * * *